US011574956B2

(12) United States Patent
Park et al.

(10) Patent No.: US 11,574,956 B2
(45) Date of Patent: Feb. 7, 2023

(54) SEMICONDUCTOR DEVICE INCLUDING DATA STORAGE MATERIAL PATTERN

(71) Applicant: SAMSUNG ELECTRONICS CO., LTD., Suwon-si (KR)

(72) Inventors: Jiho Park, Suwon-si (KR); Kwangmin Park, Seoul (KR); Wonjun Park, Hwaseong-si (KR); Jeonghee Park, Hwaseong-si (KR); Changyup Park, Hwaseong-si (KR); Hwasung Chae, Iksan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 92 days.

(21) Appl. No.: 17/314,638

(22) Filed: May 7, 2021

(65) Prior Publication Data
US 2022/0085105 A1  Mar. 17, 2022

(30) Foreign Application Priority Data

Sep. 16, 2020 (KR) .......................... 10-2020-0118742

(51) Int. Cl.
*H01L 27/24* (2006.01)
*H01L 45/00* (2006.01)

(52) U.S. Cl.
CPC .......... *H01L 27/2436* (2013.01); *H01L 45/06* (2013.01); *H01L 45/1233* (2013.01); *H01L 45/1253* (2013.01)

(58) Field of Classification Search
CPC .................. H01L 45/1233; H01L 45/1253
See application file for complete search history.

(56) References Cited

U.S. PATENT DOCUMENTS

| 9,559,146 | B2 | 1/2017 | Liu et al. |
| 9,812,501 | B2 | 11/2017 | Lee et al. |
| 10,355,203 | B2 * | 7/2019 | Ito ........................... H01L 43/08 |
| 11,183,538 | B2 * | 11/2021 | Jeong ................. G11C 13/0069 |

(Continued)

FOREIGN PATENT DOCUMENTS

| KR | 10-2009-0036176 A | 4/2009 |
| KR | 10-2009-0038065 A | 4/2009 |

(Continued)

*Primary Examiner* — Mounir S Amer
(74) *Attorney, Agent, or Firm* — Lee IP Law, P.C.

(57) ABSTRACT

A semiconductor device includes a substrate; first conductive lines extending in a first direction; second conductive lines extending in a second direction; memory cell structures between the first conductive lines and the second conductive lines; and dummy cell structures that are electrically isolated and between the first conductive lines and the second conductive lines. The memory cell structures include a data storage material pattern including a phase change material layer; and a selector material pattern overlapping the data storage material pattern in a vertical direction. The dummy cell structures include a dummy pattern including a phase change material layer. The phase change material layer of the dummy pattern includes a crystalline phase portion and an amorphous phase portion. At a cross section of the phase change material layer of the dummy pattern, an area of the crystalline phase portion is larger than an area of the amorphous phase portion.

20 Claims, 17 Drawing Sheets

(56) References Cited

U.S. PATENT DOCUMENTS

| | | | |
|---|---|---|---|
| 2008/0019170 A1* | 1/2008 | Happ | ................... H01L 45/1233 |
| | | | 365/163 |
| 2009/0093868 A1 | 4/2009 | Kim et al. | |
| 2009/0290476 A1 | 11/2009 | Okada | |
| 2015/0249110 A1* | 9/2015 | Do | ........................ H01L 27/222 |
| | | | 257/421 |
| 2015/0369114 A1* | 12/2015 | Bruss | ........................ F01P 11/08 |
| | | | 123/41.33 |
| 2020/0091242 A1 | 3/2020 | Cheng | |
| 2021/0151505 A1* | 5/2021 | Han | ........................ H01L 43/12 |
| 2022/0085105 A1* | 3/2022 | Park | .................... H01L 27/2481 |
| 2022/0102626 A1* | 3/2022 | Li | ........................ H01L 45/146 |
| 2022/0165948 A1* | 5/2022 | Kersting | ............... H01L 45/149 |

FOREIGN PATENT DOCUMENTS

| | | | |
|---|---|---|---|
| KR | 10-2009-0116344 A | 11/2009 | |
| KR | 10-2010-0052312 A | 5/2010 | |

\* cited by examiner

SEMICONDUCTOR DEVICE INCLUDING DATA STORAGE MATERIAL PATTERN

CROSS-REFERENCE TO RELATED APPLICATION

Korean Patent Application No. 10-2020-0118742, filed on Sep. 16, 2020, in the Korean Intellectual Property Office, and entitled: "Semiconductor Device Including Data Storage Material Pattern," is incorporated by reference herein in its entirety.

BACKGROUND

1. Field

Embodiments relate to a semiconductor device including a data storage material pattern.

2. Description of the Related Art

Next-generation memory devices such as a PRAM and a RRAM have been developed in accordance with the trend for higher performance and lower power of a semiconductor device such as a memory device. Such next-generation memory devices may be developed using a data storage material of which a resistance value may change, depending on a current or a voltage and which may maintain a resistance value even when a current or a voltage is not supplied.

SUMMARY

Embodiments are directed to a semiconductor device, including: a semiconductor substrate having a cell region and a dummy region; first conductive lines extending in a first direction on the semiconductor substrate; second conductive lines disposed on the first conductive lines and extending in a second direction perpendicular to the first direction; a plurality of memory cell structures disposed between the first conductive lines and the second conductive lines on the cell region of the semiconductor substrate; and a plurality of dummy cell structures that are electrically isolated and disposed between the first conductive lines and the second conductive lines on the dummy region of the semiconductor substrate. Each of the plurality of memory cell structures includes: a data storage material pattern disposed between the first conductive lines and the second conductive lines and including a phase change material layer; and a selector material pattern overlapping the data storage material pattern in a vertical direction. Each of the plurality of dummy cell structures includes a dummy pattern disposed between the first conductive lines and the second conductive lines and including a phase change material layer. The phase change material layer of the dummy pattern includes a crystalline phase portion and an amorphous phase portion. At a cross section of the phase change material layer of the dummy pattern, an area of the crystalline phase portion is larger than an area of the amorphous phase portion.

Embodiments are also directed to a semiconductor device, including: a semiconductor substrate; a first conductive line extending in a first direction on the semiconductor substrate; a second conductive line disposed on the first conductive line and extending in a second direction perpendicular to the first direction; and a stack structure disposed between the first conductive line and the second conductive line on the semiconductor substrate. The stack structure includes: a lower electrode pattern in contact with the first conductive line; an upper electrode pattern in contact with the second conductive line; an intermediate electrode pattern disposed between the lower electrode pattern and the upper electrode pattern; a first material pattern and a second material pattern spaced apart from each other in a vertical direction by the intermediate electrode pattern; a lower metal pattern in contact with a lower surface of the second material pattern; and an upper metal pattern in contact with an upper surface of the second material pattern. An upper surface of the upper metal pattern includes a first surface and a second surface that extends from the first surface and bends downward towards the semiconductor substrate. A lower portion of a lateral surface of the upper electrode pattern is tapered such that a width of the upper electrode pattern increases towards a lower end.

Embodiments are also directed to a semiconductor device, including: a lower structure including a semiconductor substrate and a peripheral circuit on the semiconductor substrate; first cell conductive lines extending in a first direction on the lower structure; first insulating patterns disposed on lateral surfaces of the first cell conductive lines and having lower ends disposed on a level lower than a level of lower ends of the first cell conductive lines; second cell conductive lines disposed on the first cell conductive lines and extending in a second direction perpendicular to the first direction; second insulating patterns on lateral surfaces of the second cell conductive lines; a plurality of memory cell structures disposed between the first cell conductive lines and the second cell conductive lines on the semiconductor substrate; and a plurality of dummy cell structures that are electrically isolated and disposed on substantially the same level as a level of the plurality of memory cell structures on the semiconductor substrate. Each of the plurality of memory cell structures includes a lower electrode pattern, a selector material pattern on the lower electrode pattern, an intermediate electrode pattern on the selector material pattern, a lower metal pattern on the intermediate electrode pattern, a data storage material pattern on the lower metal pattern, an upper metal pattern on the data storage material pattern, and an upper electrode pattern on the upper metal pattern. Each of the plurality of dummy cell structures includes a dummy lower electrode pattern, a first dummy pattern on the dummy lower electrode pattern, a dummy intermediate electrode pattern on the first dummy pattern, a dummy lower metal pattern on the dummy intermediate electrode pattern, a second dummy pattern on the dummy lower metal pattern, a dummy upper metal pattern on the second dummy pattern, and a dummy upper electrode pattern on the dummy upper metal pattern. The data storage material pattern includes a phase change material layer, of which a phase changes from an amorphous phase to a crystalline phase or from a crystalline phase to an amorphous phase during a write operation and an erase operation. The second dummy pattern includes a phase change material layer that is electrically isolated and maintains a crystalline phase. Each of the upper metal pattern and the dummy upper metal pattern includes a central portion and an end portion that extends from the central portion and bends downward.

BRIEF DESCRIPTION OF DRAWINGS

Features will become apparent to those of skill in the art by describing in detail example embodiments with reference to the attached drawings in which.

DETAILED DESCRIPTION

Figure 1A:
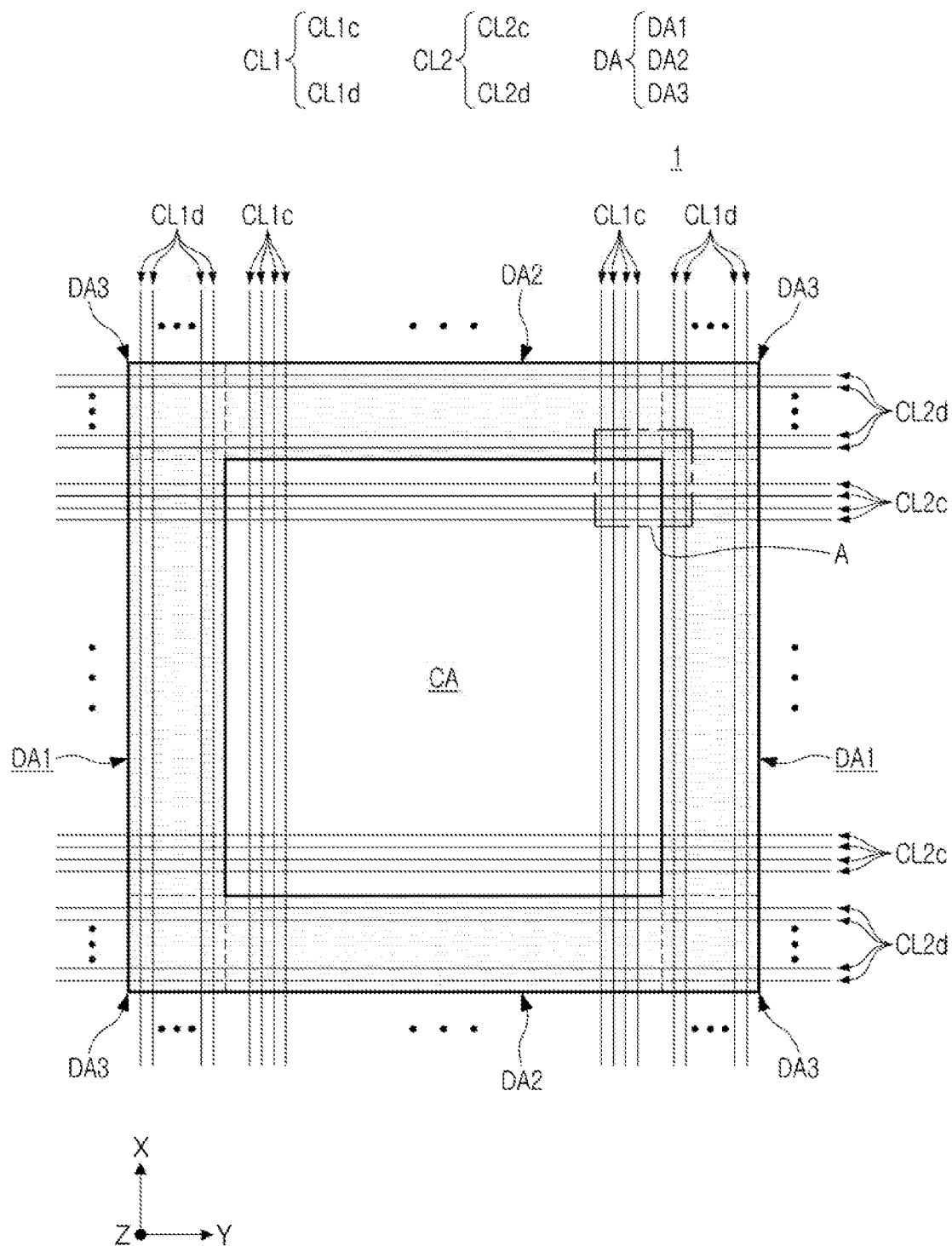
FIG. 1A is a plan view illustrating a semiconductor device according to an example embodiment.
Figure 1B:
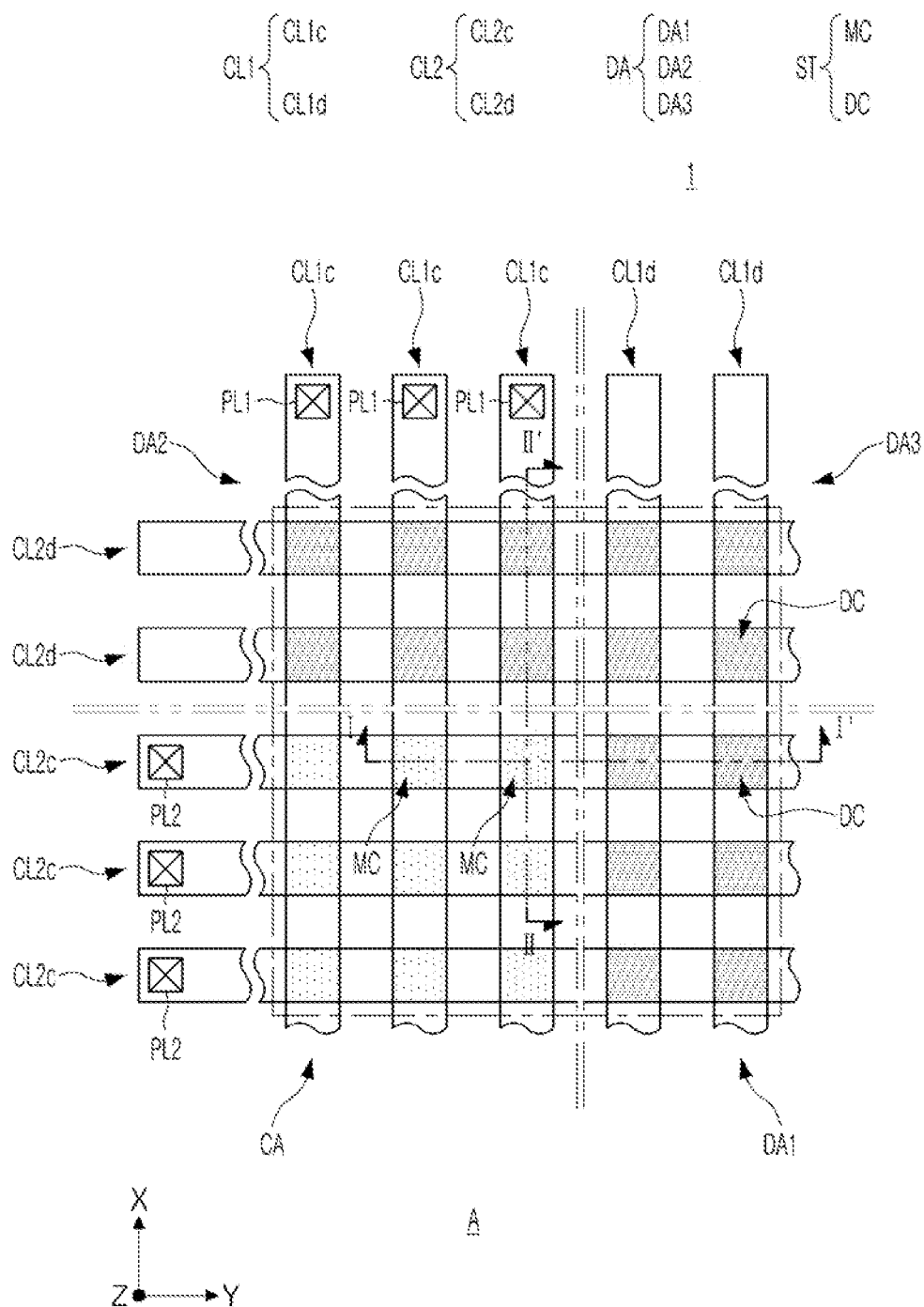
FIG. 1B is an enlarged plan view illustrating a portion of a semiconductor device according to an example embodiment.
Figure 2A:
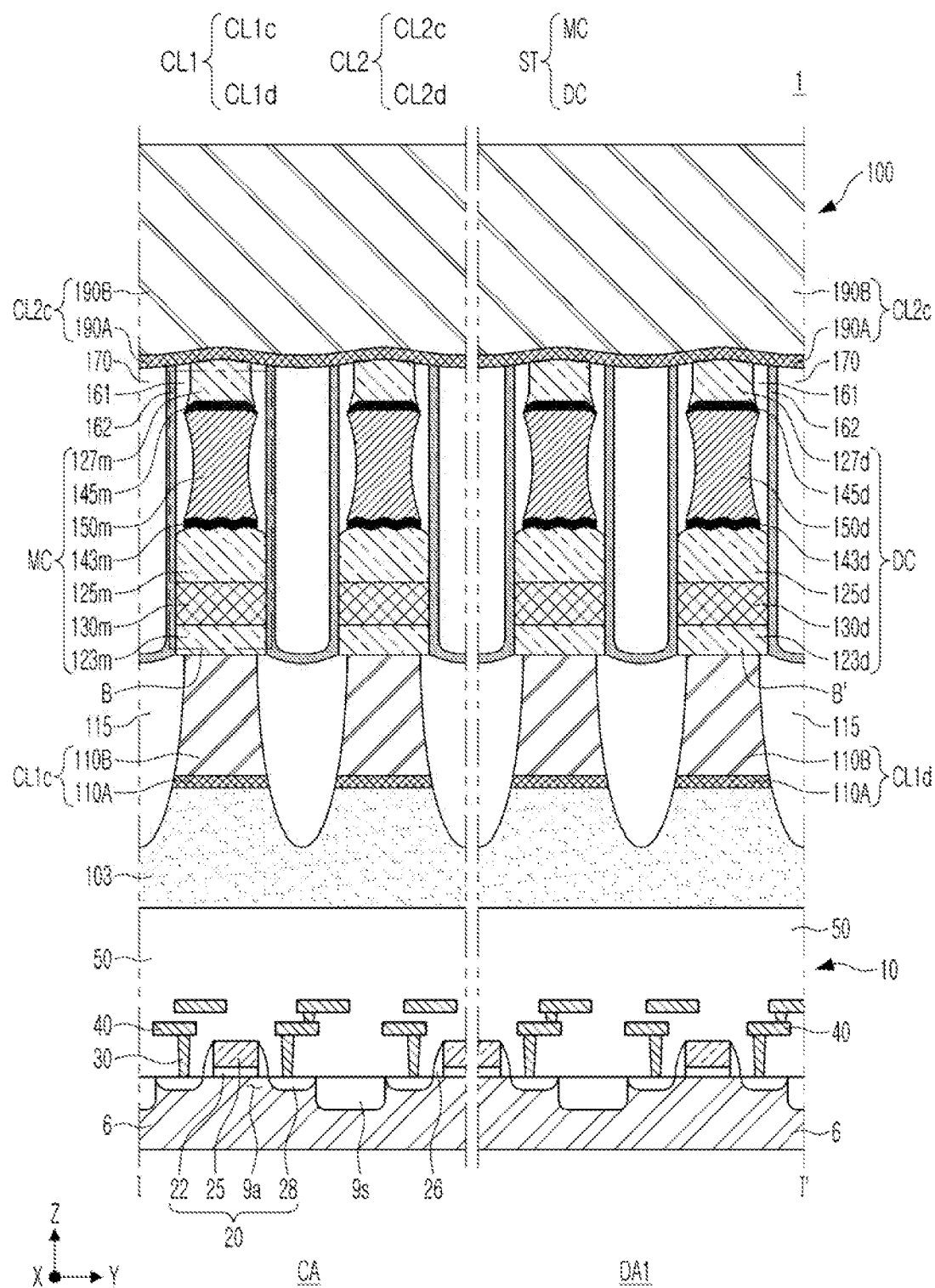
FIGS. 2A and 2B are cross-sectional views illustrating a semiconductor device according to an example embodiment.
Figure 2B:
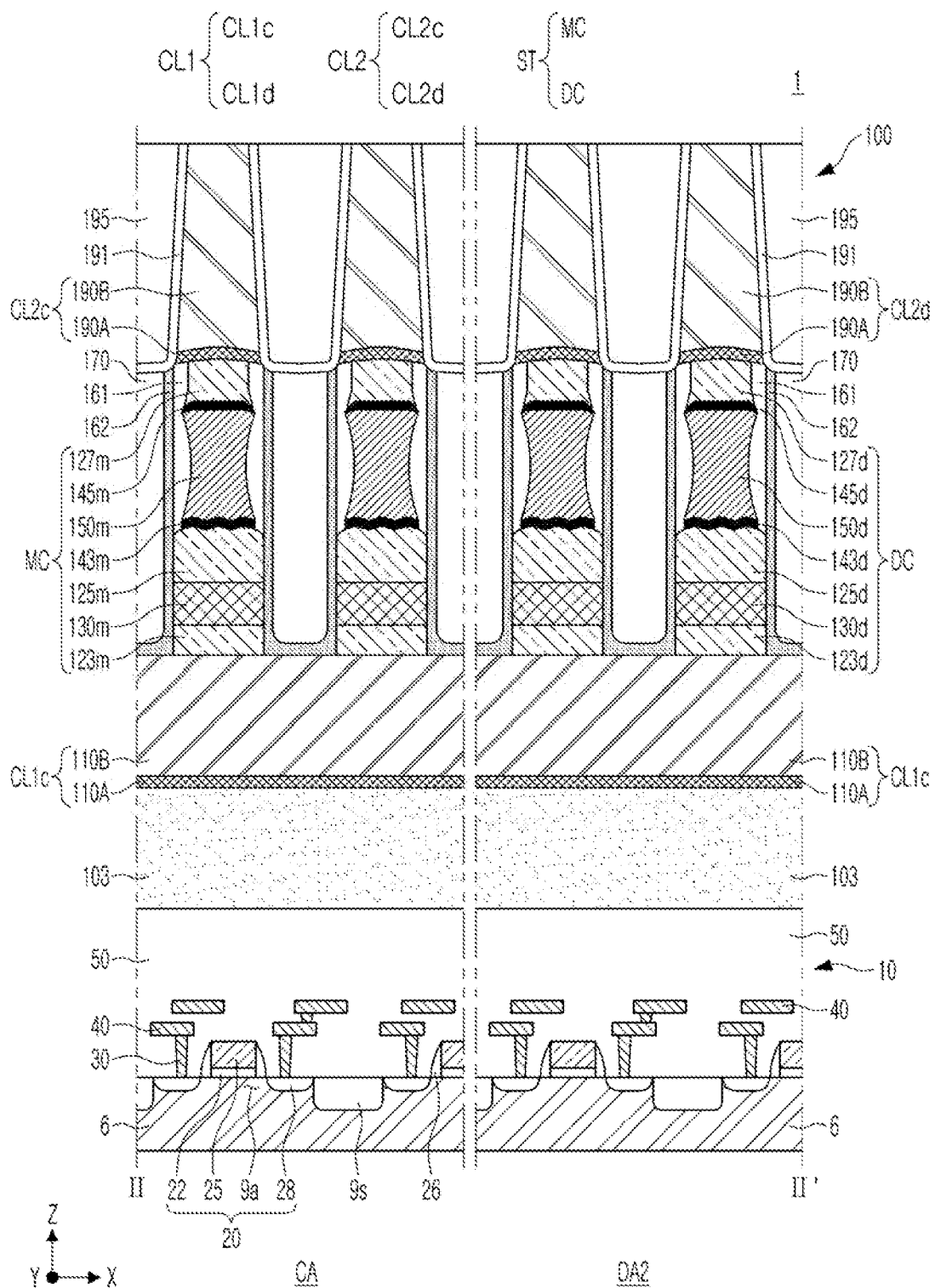
Figure 3:
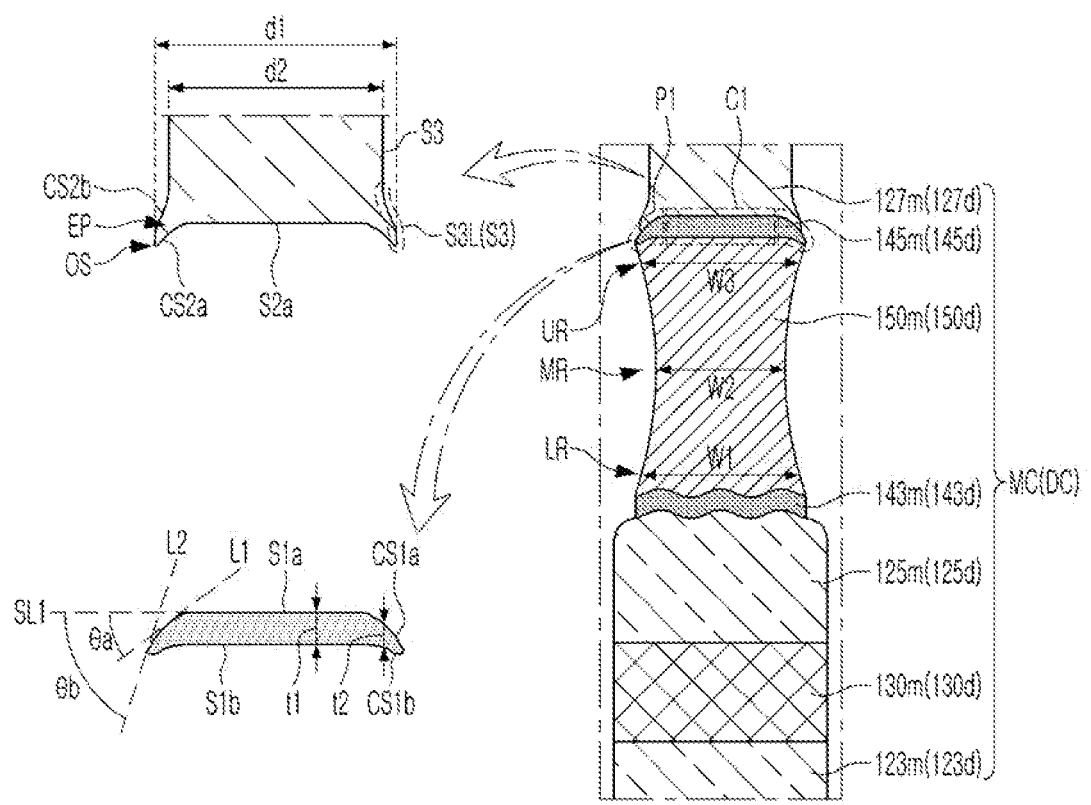
FIG. 3 is a cross-sectional view illustrating a semiconductor device according to an example embodiment.

FIG. 1A is a plan view illustrating a semiconductor device according to an example embodiment. FIG. 1B is an enlarged plan view illustrating a portion of a semiconductor device according to an example embodiment, illustrating portion "A" illustrated in FIG. 1A. FIGS. 2A and 2B are cross-sectional views illustrating a semiconductor device according to an example embodiment. FIG. 2A is a cross-sectional view illustrating a semiconductor device taken along line I-I', and FIG. 2B is a cross-sectional view illustrating a semiconductor device taken along line FIG. 3 is a cross-sectional view illustrating a semiconductor device according to an example embodiment, illustrating portion "B" illustrated in FIG. 2A.

Referring to FIGS. 1A to 3, a semiconductor device 1 may include a lower structure 10 and an upper structure 100 on the lower structure 10.

The lower structure 10 may include a semiconductor substrate 6, circuit devices 20 on the semiconductor substrate 6, circuit contact plugs 30 and circuit wirings 40 electrically connected to the circuit devices 20, and lower insulating structure 50 covering the circuit devices 20 on the semiconductor substrate 6.

The upper structure 100 may include first conductive lines CL1 extending in a first direction X on the lower structure 10, second conductive lines CL2 extending in a second direction Y, and stack structures ST disposed between the first conductive lines CL1 and the second conductive lines CL2 in a region in which the first conductive lines CL1 intersect the second conductive lines CL2. The stack structures ST may include memory cell structures MC and dummy cell structures DC.

The upper structure 100 may include a base insulating layer 103, first insulating patterns 115, second insulating patterns 195, first spacers 161, second spacers 162, third spacers 191, and a gap-fill insulating pattern 170.

The semiconductor substrate 6 may be a single crystal silicon substrate. A device isolation layer 9s may be formed in the semiconductor substrate 6 such that an active region 9a may be defined.

The circuit devices 20 may include a gate insulating layer 22, a gate electrode 25, and source/drain regions 28. The gate electrode 25 may be disposed on the active region 9a defined by the device isolation layer 9s. The source/drain regions 28 may be formed in the active regions 9a on both sides of the gate electrode 25. The gate insulating layer 22 may be disposed between the gate electrode 25 and the active region 9a. Gate spacers 26 may be disposed on both sidewalls of the gate electrode 25.

The lower insulating structure 50 may be disposed on the circuit device 20 on the semiconductor substrate 6. The circuit contact plugs 30 may penetrate a portion of the lower insulating structure 50 and may be connected to the source/drain regions 28. An electric signal may be applied to the circuit device 20 by the circuit contact plugs 30. Circuit wirings 40 may be connected to the circuit contact plugs 30 and may be disposed in a plurality of layers. The circuit device 20 may be connected to first cell conductive lines CL1c or second cell conductive lines CL2c through contact plugs.

The first conductive lines CL1 may extend in the first direction X on the base insulating layer 103, and may be spaced apart from each other in the second direction Y. A plurality of the first conductive lines CL1 may be disposed in parallel. The first direction X and the second direction Y may be parallel to an upper surface of the semiconductor substrate 6 and may be perpendicular to each other. Lateral surfaces of each of the first conductive lines CL1 may be inclined with respect to a surface of the semiconductor substrate 6. For example, the first conductive lines CL1 may have a tapered shape of which a width decreases upwardly.

As illustrated in FIG. 1A, the first conductive lines CL1 may include first cell conductive lines CL1c and first dummy conductive lines CL1d. The first cell conductive lines CL1c may be disposed to cross the cell region CA of the semiconductor device 1. The first dummy conductive lines CL1d may be disposed to cross the dummy region DA of the semiconductor device 1. The dummy region DA may be disposed on at least one side of the cell region CA, and may be disposed to surround the cell region CA, for example.

The second conductive lines CL2 may extend in the second direction Y on the first conductive lines CL1 and may be disposed to be spaced apart from each other in the first direction X. A plurality of the second conductive lines CL2 may be disposed in parallel. Lateral surfaces of each of the second conductive lines CL2 may be inclined with respect to a surface of the semiconductor substrate 6. For example, the second conductive lines CL2 may have a tapered shape of which a width decreases upwardly.

As illustrated in FIG. 1A, the second conductive lines CL2 may include second cell conductive lines CL2c and second dummy conductive lines CL2d. The second cell conductive lines CL2c may be disposed to cross the cell region CA of the semiconductor device 1. The second dummy conductive lines CL2d may be disposed to cross the dummy region DA of the semiconductor device 1.

A region in which the first cell conductive lines CL1c intersect the second cell conductive lines CL2c may be defined as a cell region CA of the semiconductor device 1. In the cell region CA, memory cell structures MC may be disposed between the first cell conductive lines CL1c and the second cell conductive lines CL2c.

The dummy region DA may be defined as an external region of the cell region CA. The dummy region DA may include a first dummy region DA1 in which the first dummy conductive lines CL1d intersect the second cell conductive lines CL2c. The dummy region DA may include a second dummy region DA2 in which first cell conductive lines CL1c intersect second dummy conductive lines CL2d. The dummy region DA may include a third dummy region DA3 in which first dummy conductive lines CL1d intersect second dummy conductive lines CL2d. The first dummy region DA1 may be disposed on both sides of the cell region CA in the second direction Y. The second dummy region DA2 may be disposed on both sides of the cell region CA in the first direction X. The third dummy region DA3 may be disposed adjacent to corners of the cell region CA. Electrically isolated dummy cell structures DC may be disposed in the dummy region DA.

The cell region CA and the dummy region DA may be defined in partial regions of the semiconductor substrate 6. For example, in a plan view, the semiconductor substrate 6 may include the cell region CA in a central portion and the dummy region DA surrounding the cell region CA.

One of the first cell conductive lines CL1c and the second cell conductive lines CL2c may be a word line, and the other may be a bit line. For example, the first cell conductive lines CL1c may be word lines, and the second cell conductive lines CL2c may be bit lines. Alternatively, the first cell conductive lines CL1c may be bit lines, and the second cell conductive lines CL2c may be word lines.

The first dummy conductive lines CL1d and the second dummy conductive lines CL2d may be in an electrically floating state. For example, as illustrated in FIG. 1B, an electrical signal may be applied to the first cell conductive lines CL1c and the second cell conductive lines CL2c through connection structures PL1 and PL2 on at least one end portion in a read/write operation or an erase operation, and an electrical signal may not be applied to the first dummy conductive lines CL1d because a connection structure is not disposed therein. Although not illustrated, a connection structure may also not be disposed on the second dummy conductive lines CL2d. Accordingly, a dummy cell structure DC may be disposed between the first dummy conductive lines CL1d and the second cell conductive lines CL2c in the first dummy region DA1. Also, a dummy cell structure DC may be disposed between the first cell conductive lines CL1c and the second dummy conductive lines CL2d in the second dummy region DA2. Also, a dummy cell structure DC may be disposed between the first dummy conductive lines CL1d and the second dummy conductive lines CL2d in the third dummy region DA3.

As illustrated in FIG. 2A, each of the first conductive lines CL1 may include a first lower conductive layer 110A and a first upper conductive layer 110B, and each of the second conductive lines CL2 may include a second lower conductive layer 190A and a second upper conductive layer 190B. The first upper conductive layer 110B may be disposed on the first lower conductive layer 110A. The second upper conductive layer 190B may be disposed on the second lower conductive layer 190A. The first and second lower conductive layers 110A and 190A may be formed of a barrier layer such as titanium nitride (TiN) or tungsten nitride (WN). The first and second upper conductive layers 110B and 190B may be formed of a metal material such as tungsten (W), titanium (Ti), aluminum (Al), and copper (Cu).

In an example embodiment, as illustrated in, e.g., FIG. 2A, lower surfaces of the second conductive lines CL2 may have a bent portion. For example, the second lower conductive layer 190A and the second upper conductive layer 190B of the second conductive lines CL2 may be upwardly convex on the memory cell structure MC and the dummy cell structure DC, and may have a downwardly convex shape on the gap-fill insulating pattern 170.

The first insulating patterns 115 may be disposed on lateral surfaces of the first conductive lines CL1. The second insulating patterns 195 may be disposed on lateral surfaces of the second conductive lines CL2. The first insulating patterns 115 may be disposed to extend in the first direction X between the first conductive lines CL1. The second insulating patterns 195 may be disposed to extend in the second direction Y between the second conductive lines CL2. Lower ends of the first insulating patterns 115 may be on a level that is lower than a level of lower ends of the first conductive lines CL1. The level in the present example embodiment may be defined on the basis of an upper surface of the semiconductor substrate 6. The first insulating patterns 115 may be disposed to partially recess into an upper portion of the base insulating layer 103. Each of the first insulating patterns 115 and the second insulating patterns 195 may include at least one of SiN, SiON, SiC, SiCN, SiOC, SiOCN, $SiO_2$, and $Al_2O_3$.

Each of the memory cell structures MC may include a lower electrode pattern 123m, a selector material pattern 130m, an intermediate electrode pattern 125m, a lower metal pattern 143m, a data storage material pattern 150m, an upper metal pattern 145m, and an upper electrode pattern 127m, stacked in order between the first cell conductive lines CL1c and the second cell conductive lines CL2c. The data storage material pattern 150m may overlap the selector material pattern 130m in a vertical direction. A planar shape of each of the patterns included in the memory cell structure MC may have various shapes such as a square shape, a rectangular shape, a quadrangular shape with rounded corners, a circular shape, an oval shape, and the like.

The lower electrode pattern 123m may be disposed on the first cell conductive lines CL1c. The intermediate electrode pattern 125m may be disposed on the selector material pattern 130m. The upper electrode pattern 127m may be disposed on the upper metal pattern 145m.

A lower surface of the lower electrode pattern 123m may be in contact with the first cell conductive lines CL1c. An upper surface of the lower electrode pattern 123m may be in contact with the selector material pattern 130m. An upper surface of the upper electrode pattern 127m may be in contact with the second cell conductive lines CL2c. A lower surface of the upper electrode pattern 127m may be in contact with the upper metal pattern 145m. A lower surface of the intermediate electrode pattern 125m may be in contact with the selector material pattern 130m. An upper surface of the intermediate electrode pattern 125m may be in contact with the lower metal pattern 143m.

Each of the lower electrode pattern 123m, the intermediate electrode pattern 125m, and the upper electrode pattern 127m may be a carbon material layer or a carbon-containing material layer. For example, the carbon-containing material layer may be a material layer including at least one of nitrogen (N) and a metal element in the carbon material layer. For example, the carbon-containing material layer may be formed of a conductive material including a metal element (e.g., tungsten (W) or titanium (Ti)) and carbon (C), such as a metal-carbon alloy material such as tungsten carbide (WC) or titanium carbide (TiC). The metal element of the metal-carbon alloy material is not limited to the aforementioned W and Ti, and may be replaced with another metal element (e.g., tantalum (Ta) or cobalt (Co)) forming an alloy with carbon (C).

The selector material pattern 130m may be disposed between the lower electrode pattern 123m and the intermediate electrode pattern 125m. The selector material pattern 130m may form an ovonic threshold switching device. The selector material pattern 130m may be referred to as a "first material pattern."

The selector material pattern 130m may be formed of a chalcogenide-based ovonic threshold switching material, which may maintain an amorphous phase when the semiconductor device operates.

For example, the selector material pattern 130m may include an alloy material containing at least two or more of arsenic (As), sulfur (S), selenium (Se), tellurium (Te), or germanium (Ge), or an additional element (e.g., silicon (Si, N, or the like) added to the above-mentioned elements, which may maintain an amorphous phase at a higher temperature.

In an example embodiment, the selector material pattern 130m may include at least one of binary compositions such as GeSe, GeS, AsSe, AsTe, AsS SiTe, SiSe, SiS, GeAs, SiAs, SnSe, or SnTe, ternary compositions such as GeAsTe, GeAsSe, AlAsTe, AlAsSe, SiAsSe, SiAsTe, GeSeTe, GeSeSb, GaAsSe, GaAsTe, InAsSe, InAsTe, SnAsSe, or SnAsTe, quaternary compositions such as GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, or GeAsTeZn, quinary compositions such as GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, or GeAsSeZnSn, and senary composition such as GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, or GeAsSeSAlSn.

In an example embodiment, the compositions may contain a small amount of at least one of elements among boron (B), C, N, and oxygen (O). In an example embodiment, the selector material pattern 130m may have a multilayer structure including two or more layers having different compositions.

In an example embodiment, the selector material pattern 130m may be formed of a single switching material layer. In another example, the selector material pattern 130m may be formed of a plurality of switching material layers having different compositions.

The data storage material pattern 150m may be disposed between the intermediate electrode pattern 125m and the upper electrode pattern 127m. The data storage material pattern 150m may be disposed between the lower metal pattern 143m and the upper metal pattern 145m. An upper surface of the data storage material pattern 150m may include a portion bent downwardly towards the semiconductor substrate 6. The data storage material pattern 150m may be referred to as a "second material pattern."

The data storage material pattern 150m may include a phase change material layer, of which a phase may change from crystalline to amorphous or from amorphous to crystalline during operation of the semiconductor device. For example, the data storage material pattern 150m may include a phase change material such as a chalcogenide material including Ge, antimony (Sb), and/or Te. Alternatively, the data storage material pattern 150m may be a phase change material including at least one element of Te or Se and at least one element of Ge, Sb, bismuth (Bi), lead (Pb), tin (Sn), As, S, Si, phosphorus (P), O, N, or In.

In an example embodiment, the data storage material pattern 150m may include at least one of binary compositions such as GeTe, GeSe, GeS, SbSe, SbTe, SbS, SbSe, SnSb, InSe, InSb, AsTe, AlTe, GaSb, AlSb, BiSb, ScSb, Ysb, CeSb, DySb, or NdSb, ternary compositions such as GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, or NdSbS, quaternary compositions such as GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, or NdGeSbS, and quinary compositions such as InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTl, GeSbSeGaZn, GeSbSeGaSn, GeSbSeAlTl, GeSbSeAlZn, GeSbSeAlSn, GeSbSeTlZn, GeSbSeTlSn, or GeSbSeZnSn.

In an example embodiment, the compositions may include a small amount of at least one element of B, C, N, O, P, cadmium (Cd), W, Ti, hafnium (Hf), and zirconium (Zr). In an example embodiment, the data storage material pattern 150m may have a multilayer structure including two or more layers having different compositions.

A laser annealing process (see FIG. 9C) may be performed to cure an etch damage of the phase change material of the data storage material pattern 150m. Internal voids in the phase change material of the data storage material pattern 150m may be removed by the laser annealing process, and crystallinity and density may be increased. As crystallization and density increase, the data storage material pattern 150*m* may be less affected by a subsequent process. Further, a width of the data storage material pattern 150*m* may decrease and a height thereof may be increased by the laser annealing process, such that resistance may increase and a threshold voltage may increase. Accordingly, a threshold voltage distribution of the data storage material patterns may improve, a yield may improve when manufacturing the semiconductor device, and a semiconductor device with improved reliability and electrical properties may be provided.

The lower metal pattern 143*m* may be disposed below the data storage material pattern 150*m*. The lower metal pattern 143*m* may be in contact with a lower surface of the data storage material pattern 150*m*. The lower metal pattern 143*m* may have a wavy surface, but an example embodiment thereof is not limited thereto.

The upper metal pattern 145*m* may be disposed on the data storage material pattern 150*m*. The upper metal pattern 145*m* may be in contact with the upper surface of the data storage material pattern 150*m*.

Each of the lower metal pattern 143*m* and the upper metal pattern 145*m* may be a metal layer or a metal alloy layer. For example, the lower metal pattern 143*m* and the upper metal pattern 145*m* may include a conductive material such as W, WN, or TiN.

Referring to FIG. 3, the upper metal pattern 145*m* may include a central portion C1 and an end portion P1, e.g., at lateral sides. The end portion P1 may be understood as a partial region including an end point of the upper metal pattern 145*m*. A first surface S1*a* of an upper surface of the upper metal pattern 145*m* may be included in the central portion C1. The end portion P1 may be disposed around the central portion C1. The end portion P1 may extend from the central portion C1 of the upper metal pattern 145*m* and may be bent downwardly. The second surface CS1*a* of the upper metal pattern 145*m* may be included in the end portion P1.

The lower end of the end portion P1 of the upper metal pattern 145*m* may be disposed on a level lower than a level of the lower end of the central portion C1. The end portion P1 of the upper metal pattern 145*m* may include a portion of which a thickness in the vertical direction Z decreases in a direction away the central portion C1. For example, the central portion C1 of the upper metal pattern 145*m* may have a first vertical thickness t1, and the end portion P1 may have a second vertical thickness t2 smaller than the first vertical thickness t1.

The upper surface of the upper metal pattern 145*m* may include a first surface S1*a* and a second surface CS1*a* extending from the first surface S1*a* and bent downwardly towards the semiconductor substrate 6, as illustrated in FIG. 3. The first surface S1*a* of the upper metal pattern 145*m* may be substantially planar, and at least a portion of the second surface CS1*a* may be curved. The second surface CS1*a* of the upper metal pattern 145*m* may be disposed on both ends of the first surface S1*a* of the upper metal pattern 145*m* in a vertical cross-sectional surface of the semiconductor device 1.

The first surface S1*a* and the second surface CS1*a* of the upper metal pattern 145*m* may form a predetermined angle. For example, as illustrated in FIG. 3, when a tangent (a linear line "L1" or "L2") of the curved portion of the second surface CS1*a* is drawn, an acute angle θa and θb formed by the tangent and a conceptual linear line SL1 extending from the first surface S1*a* may be defined. The angle defined as above may be changed or maintained from a portion in which the second surface CS1*a* is connected to the first surface S1*a* to the lower end of the second surface CS1*a*.

The angle may be greater than 0° and less than 90°. When the angle is 0°, an entire upper surface may be planar without the second surface CS1*a*. When the angle is 90°, an angle formed by an extension line of a lateral surface extending from the second surface CS1*a* with the conceptual linear line SL1 of the first surface S1*a* may be 90°. In an example embodiment, a maximum value θb of the angle may have a range of about 10° to about 70°. In an example embodiment, a maximum value θb of the angle may have a range of about 10° to about 40°. The numerical range of the angles may be provided by the laser annealing process (see FIG. 9C).

The lower surface of the upper metal pattern 145*m* may include a third surface S1*b* and a fourth surface CS1*b* extending from the third surface S1*b* and bent downwardly towards the semiconductor substrate 6. The third surface S1*b* may be substantially planar, and at least a portion of the fourth surface CS1*b* may be curved. The fourth surface CS1*b* may be disposed on both ends of the third surface S1*b* of the upper metal pattern 145*m* in a vertically cut-out surface of the semiconductor device 1.

In the example embodiment, the structure (a width and a height) may change as a phase change material layer of the data storage material pattern 150*m* is crystallized by the laser annealing process (see FIG. 9C), such that the upper metal pattern 145*m* may have the structure described above.

The lower surface of the upper electrode pattern 127*m* may include a first surface S2*a* and a second surface CS2*a* extending from the first surface S2*a* and bent downwardly towards the semiconductor substrate 6. A lateral surface of the upper electrode pattern 127*m* may include a third surface S3 and a fourth surface CS2*b* extending from the third surface S3 and bent in a direction of being spaced apart from to center of the upper electrode pattern 127*m*. Each of the second surface CS2*a* and the fourth surface CS2*b* of the upper metal pattern 145*m* may include a curved portion.

The upper electrode pattern 127*m* may include an edge portion EP covering at least a portion of the second surface CS1*a* of the upper metal pattern 145*m*. The edge portion EP may include a second surface CS2*a* covering at least a portion of the second surface CS1*a*. The edge portion EP may include a fourth surface CS2*b* extending upwardly from the lower end of the second surface CS2*a*.

The lower end of the second surface CS2*a* of the upper electrode pattern 127*m* may be disposed on a level lower than a level of the first surface S1*a* of the upper metal pattern 145*m*. The edge portion EP may have a sharp, or pointed, shape formed by the second surface CS2*a* and the fourth surface CS2*b* of the upper electrode pattern 127*m*.

The lateral surface of the upper electrode pattern 127*m* may include a lower portion S3L, and the lower portion S3L may be tapered such that a width of the upper electrode pattern 127*m* may increase towards the lower end. The upper electrode pattern 127*m* may include a portion in which a horizontal distance between lateral surfaces of the upper electrode pattern 127*m* increases downwardly.

For example, a horizontal distance d1 between outermost points OS of the edge portions EP of the upper electrode pattern 127*m* may be greater than a width d2 of the upper region of the upper electrode pattern 127*m*.

The data storage material pattern 150*m* may include a lower region LR adjacent to the lower metal pattern 143*m*, an upper region UR adjacent to the upper metal pattern 145*m*, and an intermediate region MR disposed between the lower region LR and the upper region UR. A width W3 of the upper region UR may be wider than a width W2 of the intermediate region MR. A width W1 of the lower region LR may be wider than the width W2 of the intermediate region MR. Each of the first to third widths W1, W2, and W3 may have a range of about 10 nm to about 20 nm.

Figure 9A:
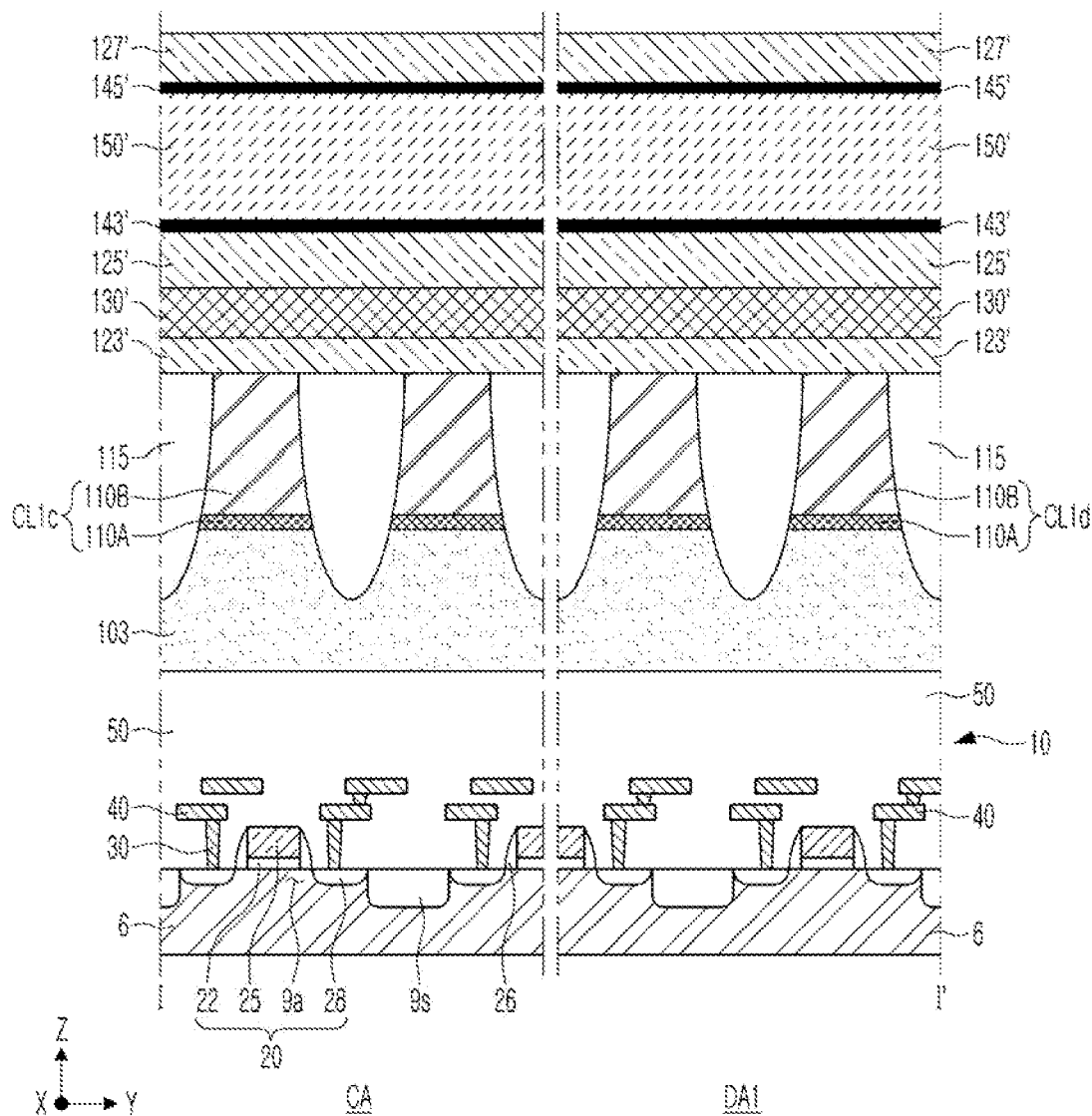
FIGS. 9A, 9B, 9C, and 9D are views illustrating a method of manufacturing a semiconductor device in process order, according to an example embodiment.
Figure 9B:
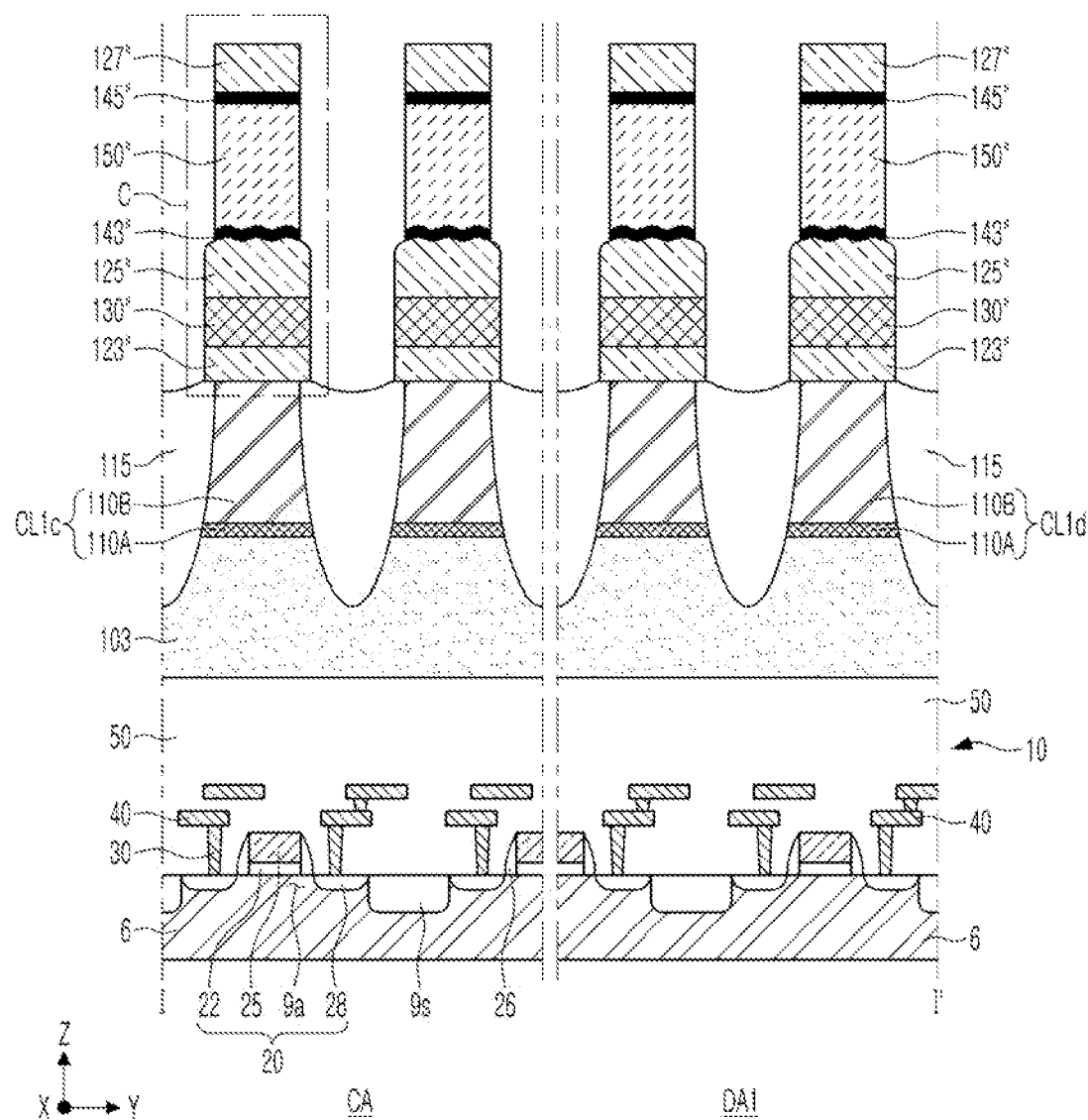
Figure 9C:
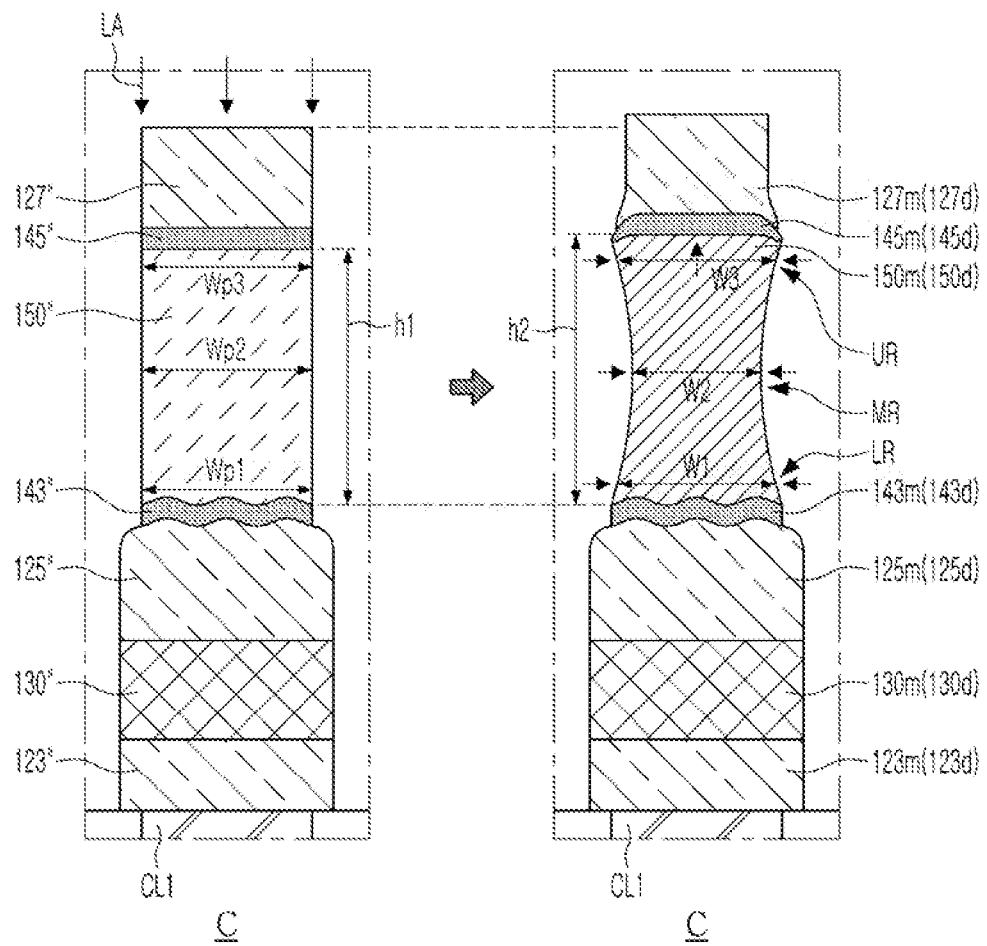

The shape of the data storage material pattern 150m, the shape of the upper metal pattern 145m, and the shape of the edge portion EP of the upper electrode pattern 127m may be formed by the laser annealing process (see FIG. 9C).

The dummy cell structures DC may have a structure the same as or similar to the structure of the memory cell structures MC, and FIG. 3 may be understood as an enlarged view illustrating a portion indicated by "B'" illustrated in FIG. 2A. The dummy cell structures DC may be disposed on substantially the same height level as that of the memory cell structures MC.

Each of the dummy cell structures DC may include a dummy lower electrode pattern 123d stacked in order between the first dummy conductive lines CL1d and the second dummy conductive lines CL2d, a first dummy pattern 130d, a dummy intermediate electrode pattern 125d, a dummy lower metal pattern 143d, a second dummy pattern 150d, a dummy upper metal pattern 145d, and a dummy upper electrode pattern 127d. The first dummy pattern 130d may be referred to as "first material pattern," and the second dummy pattern 150d may be referred to as "second material pattern."

The dummy lower electrode pattern 123d may correspond to the lower electrode pattern 123m. The first dummy pattern 130d may correspond to the selector material pattern 130m. The dummy intermediate electrode pattern 125d may correspond to the intermediate electrode pattern 125m. The dummy lower metal pattern 143d may correspond to the lower metal pattern 143m. The second dummy pattern 150d may correspond to the data storage material pattern 150m. The dummy upper metal pattern 145d may correspond to the upper metal pattern 145m. The dummy upper electrode pattern 127d may correspond to the upper electrode pattern 127m. Each of the elements included in the dummy cell structures DC will be understood by the descriptions of the memory cell structures MC unless otherwise indicated.

For example, the dummy upper metal pattern 145d may have a first surface S1a and a second surface CS1a, as illustrated in FIG. 3A, and the dummy upper electrode pattern 127d may include an edge portion EP, and the edge portion EP may cover at least a portion of the second surface CS1a of the dummy upper metal pattern 145d and may have a sharp shape.

Differently from the memory cell structures MC, the dummy cell structures DC may be electrically isolated, such that the second dummy pattern 150d may be electrically isolated and may thus include a phase change material layer which may maintain a crystalline phase in a write operation or an erase operation of the semiconductor device.

In an example embodiment, the phase change material layer of the second dummy pattern 150d may include a crystalline phase portion and an amorphous phase portion. At a cross-section of the phase change material layer of the second dummy pattern 150d, an area of the crystalline phase portion may be larger than an area of the amorphous phase portion. For example, at a cross-section of the phase change material layer of the second dummy pattern 150d, an area of the crystalline phase portion may be about 50% or more of an entire area of the phase change material layer of the second dummy pattern 150d. At a cross-section of the phase change material layer of the second dummy pattern 150d, an area of the crystalline phase portion may be about 80% or more of an entire area of the phase change material layer of the second dummy pattern 150d, about 80% or more and about 100% or less, for example. The area of the crystalline phase portion may be defined as a sum of the areas of a plurality of grains formed by crystallizing the phase change material layer of the second dummy pattern 150d. Alternatively, the area of the crystalline phase portion may be obtained from the area of a portion of the amorphous phase portion which has not been partially crystallized among the plurality of grains. For example, the area of the crystalline phase may be substantially equal to a value obtained by subtracting the area of the amorphous phase portion from the entire area of the phase change material layer of the second dummy pattern 150d.

In an example embodiment, a maximum value of a grain size of the crystalline phase portion included in the phase change material layer of the second dummy pattern 150d may range from about 5 nm to about 20 nm.

The first and second spacers 161 and 162 may cover lateral surfaces of the memory cell structures MC and lateral surfaces of the dummy cell structures DC. The first and second spacers 161 and 162 may cover a portion of the upper surfaces of the first conductive lines CL1 and a portion of the upper surfaces of the first insulating patterns 115.

The first and second spacers 161 and 162 may include one or a plurality of layers. For example, the first and second spacers 161 and 162 may include a first spacer 161 and a second spacer 162 on the first spacer 161. The first spacer 161 may be disposed to cover lateral surfaces of the lower metal pattern 143m, the data storage material pattern 150m, the upper metal pattern 145m, and the upper electrode pattern 127m on the intermediate electrode pattern 125m. The second spacers 162 may be disposed on an external lateral surface of the first spacer 161 and may be disposed to extend downwardly further than the first spacer 161. The lower end of the second spacer 162 may be disposed to be partially recessed into the upper portions of the first insulating patterns 115. In example embodiments, the first and second spacers 161 and 162 may be formed as a single spacer layer covering lateral surfaces of the memory cell structures MC and lateral surfaces of the dummy cell structures DC.

The third spacers 191 may be disposed to cover lateral surfaces of the second conductive lines CL2. The third spacers 191 may be disposed to be partially recessed into upper portions of the first and second spacers 161 and 162 and upper portions of the gap-fill insulating pattern 170. A lower end of the recessed portion of the gap-fill insulating pattern 170 may be disposed on a level lower than a level of an upper surface of the upper electrode pattern 127m. The second insulating pattern 195 may be disposed to fill the space between the third spacers 191.

Each of the first to third spacers 161, 162, and 191 may include at least one of SiN, $SiO_2$, SiON, SiBN, SiCN, SiOCN, $Al_2O_3$, AlN, or AlON.

The gap-fill insulating pattern 170 may be disposed to fill a region between the memory cell structures MC, a region between the dummy cell structures DC, and a region between the memory cell structure MC and the dummy cell structure DC on the first and second spacers 161 and 162. In example embodiments, a void may be formed in the gap-fill insulating pattern 170. The gap-fill insulating pattern 170 may include at least one of SiN, SiON, SiC, SiCN, SiOC, SiOCN, $SiO_2$, or $Al_2O_3$.

FIGS. 4A, 4B, 4C, 4D, and 4E are enlarged cross-sectional views illustrating a semiconductor device according to an example embodiment, illustrating a region corresponding to FIG. 3.

Figure 4A:
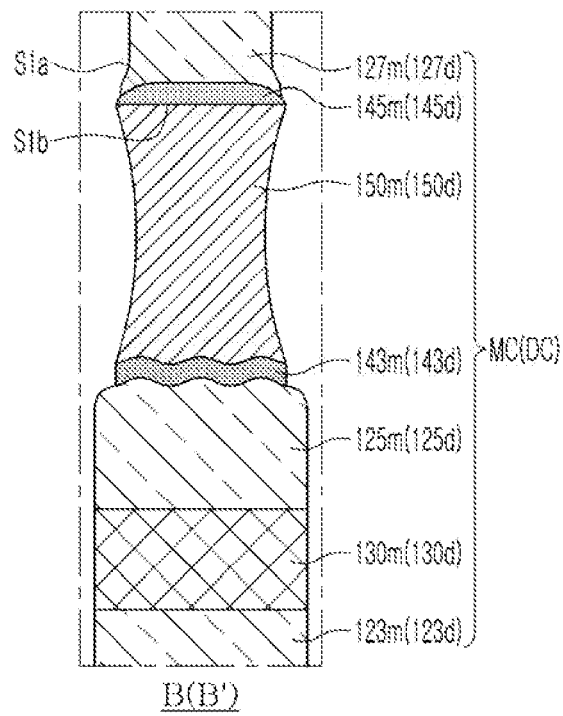
FIGS. 4A, 4B, 4C, 4D, and 4E are enlarged cross-sectional views illustrating a semiconductor device according to an example embodiment.

Referring to FIG. 4A, an upper surface S1a of the upper metal pattern 145m may be upwardly convex, and a lower surface S1b of the upper metal pattern 145m may be substantially planar. In the example embodiment, a maximum value θb of the angle described with reference to FIG. 3 may be about 40° or less. The upper electrode pattern 127m may have the same structure as the structure described with reference to FIG. 3. The structure in the example embodiment may be formed by the laser annealing process (see FIG. 9C), and as described with reference to FIG. 3, the structure may appear in the memory cell structures MC and also in the dummy cell structures DC.

Figure 4B:
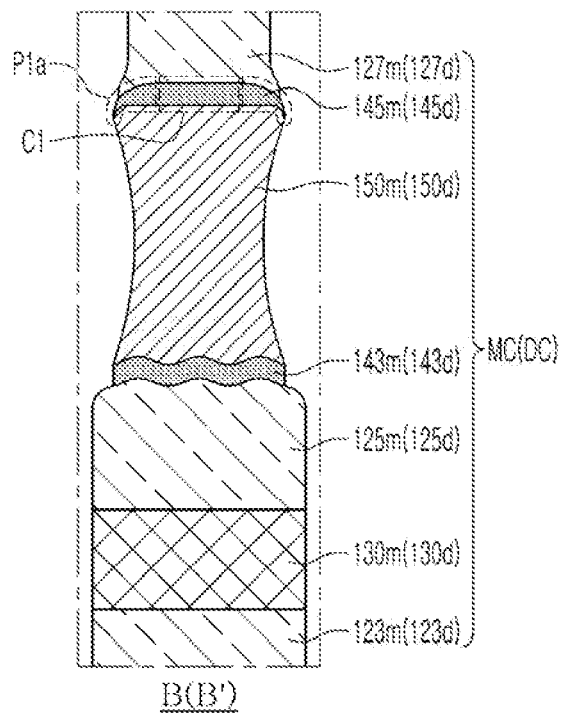

Referring to FIG. 4B, the upper metal pattern 145m may include a central portion C1 and end portions P1a, and the end portions P1a may be bent downwardly, and a lower end may have a sharp shape. The lower end may be disposed on a level lower than a level of the lower end of the central portion C1. An upper edge of the data storage material pattern 150m may be rounded. The lower ends of the end portions P1a of the upper metal pattern 145m may cover the rounded upper corners of the data storage material pattern 150m. The structure in the example embodiment may be formed by the laser annealing process (see FIG. 9C), and as described with reference to FIG. 3, the structure may appear in the memory cell structures MC and also in the dummy cell structures DC.

Figure 4C:
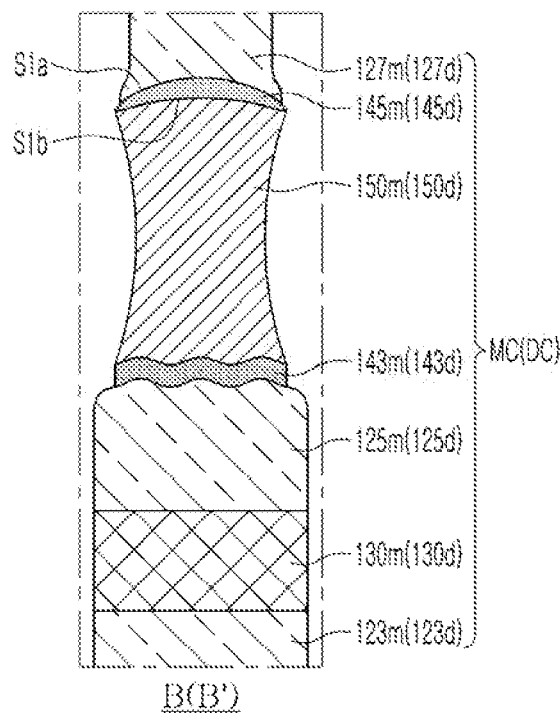

Referring to FIG. 4C, the upper metal pattern 145m may include an upper surface S1a upwardly convex and a lower surface S1b upwardly concave. A vertical thickness of the upper metal pattern 145m may decrease from a central portion to an end portion. The upper surface of the data storage material pattern 150m may be in contact with a lower surface of the upper metal pattern 145m and may be upwardly convex. The structure in the example embodiment may be formed by the laser annealing process (see FIG. 9C), and as described with reference to FIG. 3, the structure may appear in the memory cell structures MC and also in the dummy cell structures DC.

Figure 4D:
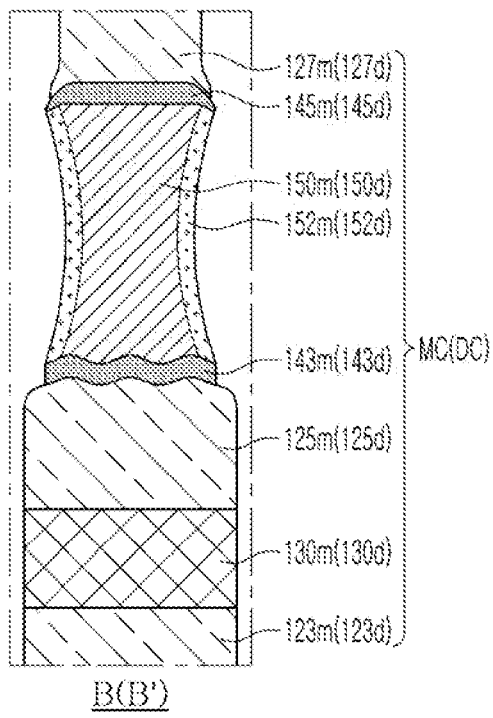

Referring to FIG. 4D, the memory cell structure MC may further include an oxide layer 152m covering a lateral surface of the data storage material pattern 150m. The data storage material pattern 150m and the oxide layer 152m may have different compositions. For example, the data storage material pattern 150m may include an Sb element, a Te element, or a Ge element, and the oxide layer 152m may include a GeO material. The dummy cell structure DC may further include a dummy oxide layer 152d covering a lateral surface of the second dummy pattern 150d, and the dummy oxide layer 152d may correspond to the oxide layer 152m, and may include the same material as that of the oxide layer 152m.

Figure 4E:
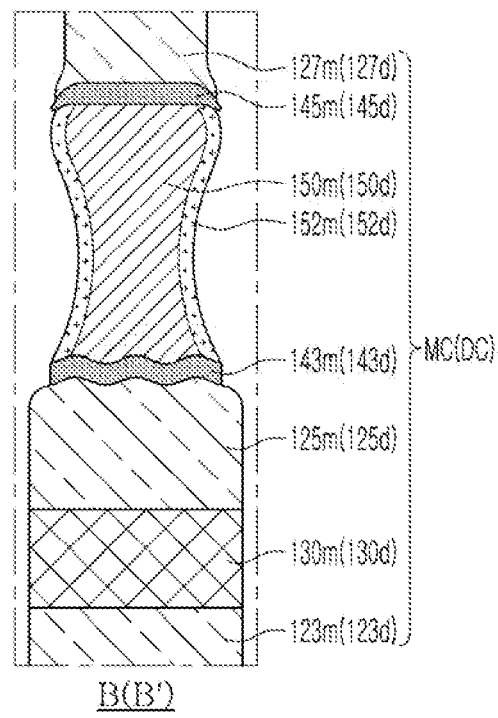

Referring to FIG. 4E, a cross-sectional shape of the data storage material pattern 150m may be partially different, and the memory cell structure MC further may include an oxide layer 152m covering a lateral surface of the data storage material pattern 150m. In the upper region of the data storage material pattern 150m, a lateral surface may have an outwardly convex shape. In the intermediate region of the data storage material pattern 150m, a lateral surface may have an inwardly concave shape.

In example embodiments, the semiconductor device 1 may include the structure of the example embodiment illustrated in FIG. 3 and the structures of the example embodiments illustrated in FIGS. 4A to 4E together. For example, in the semiconductor device 1, a portion of the plurality of memory cell structures MC may have the structure of the example embodiment illustrated in FIG. 3, and other portions may have the structure of the example embodiment illustrated in FIG. 4A.

Figure 5:
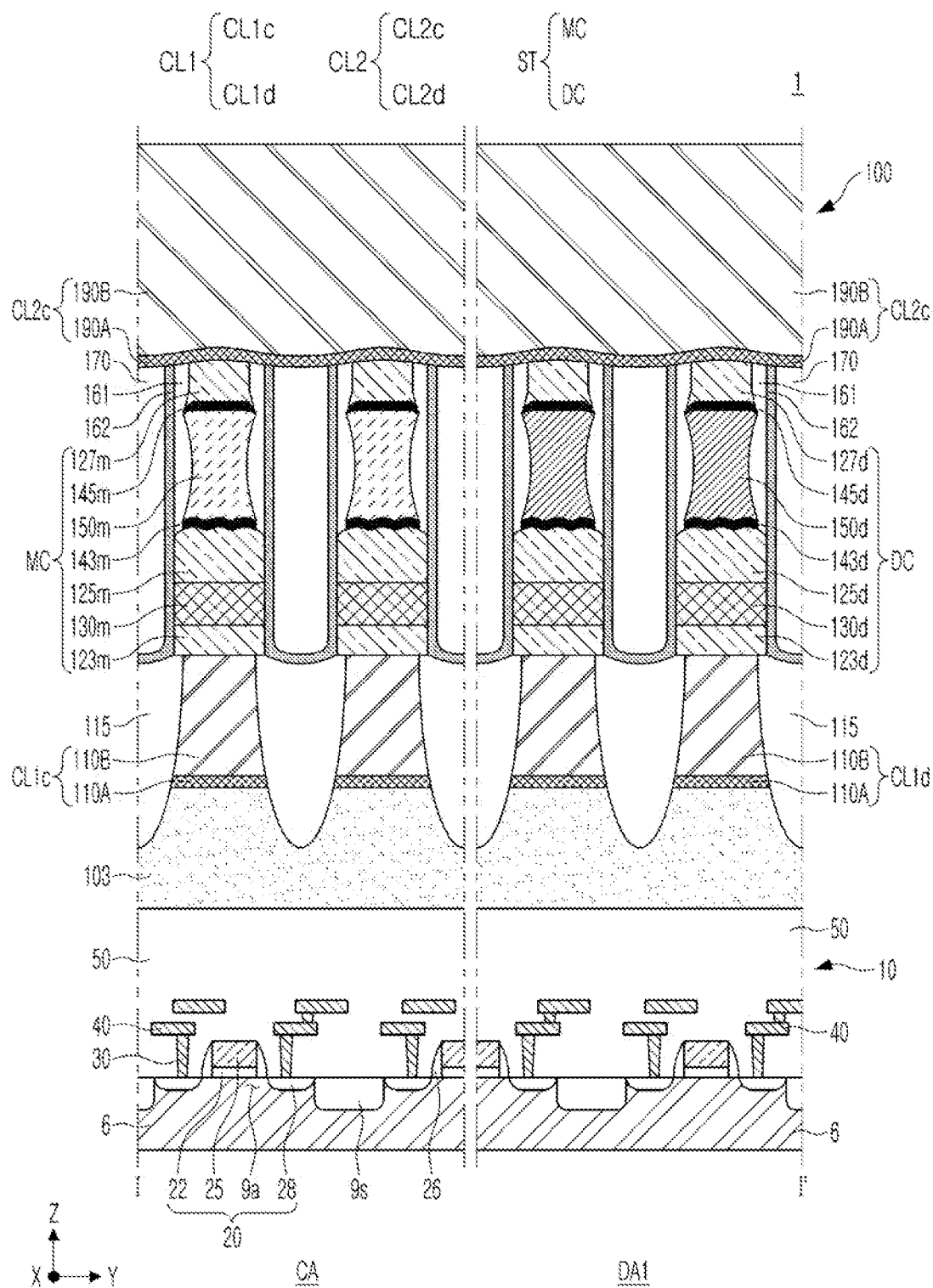
FIG. 5 is a cross-sectional view illustrating a semiconductor device according to an example embodiment.

FIG. 5 is a cross-sectional view illustrating a semiconductor device according to an example embodiment.

FIG. 5 illustrates whether a phase of the phase change material layer of the data storage material pattern 150m of the memory cell structures MC and a phase of the phase change material layer of the second dummy pattern 150d of the dummy cell structures DC changes when the semiconductor device 1 operates. The operation of the semiconductor device 1 may be a write operation and an erase operation. Referring back to FIG. 1B, in the cell region CA, the phase change material layer of the data storage material pattern 150m may change from a crystalline phase to an amorphous phase during a program operation (indicated by a different hatching pattern), and in the dummy region DA (e.g., DA1), the second dummy pattern 150d may be electrically isolated, such that the phase change material layer of the second dummy pattern 150d may maintain the crystalline phase even when the semiconductor device operates.

Figure 6:
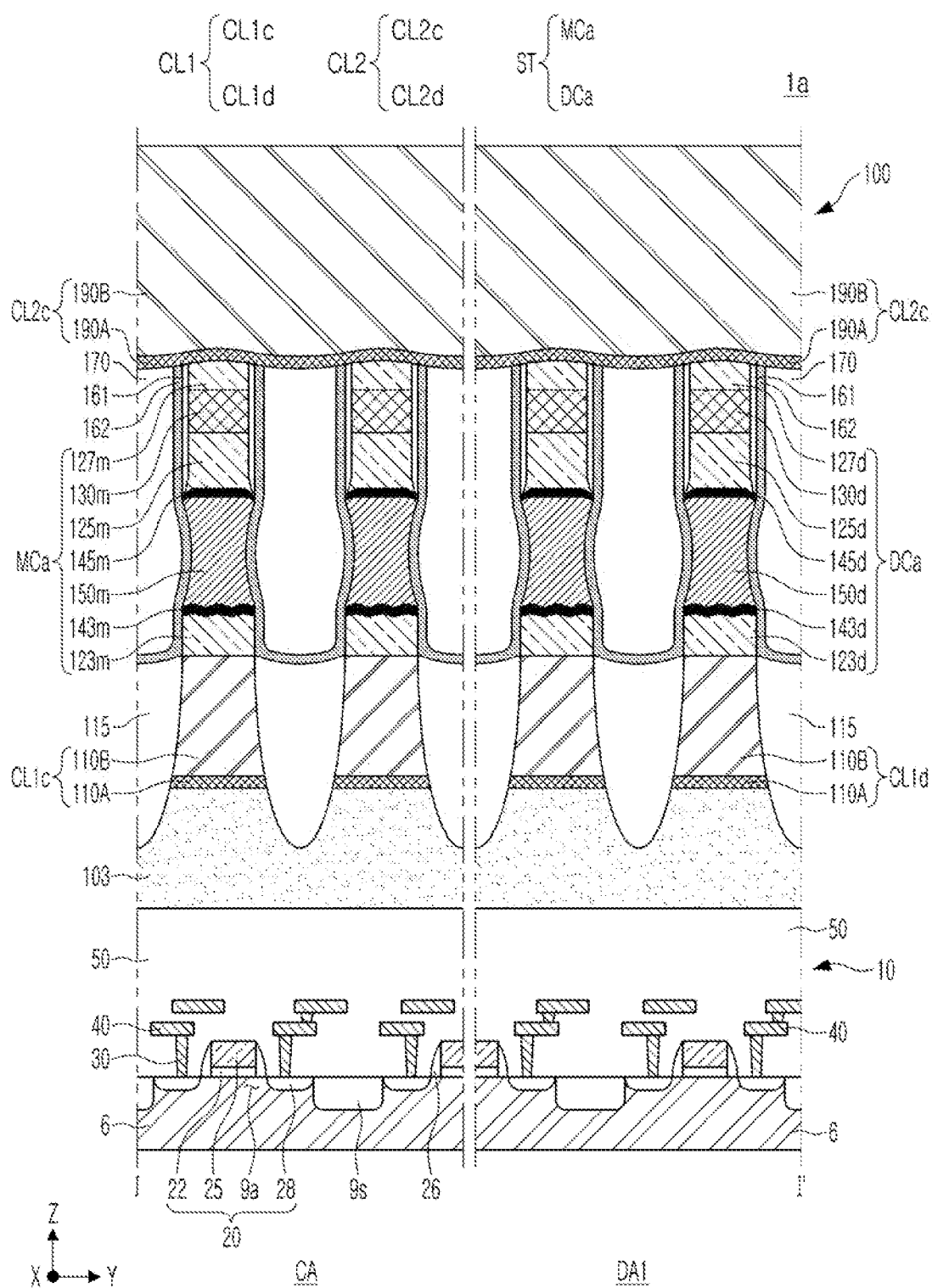
FIGS. 6, 7, 8A, and 8B are cross-sectional views illustrating a semiconductor device according to an example embodiment.

FIG. 6 is a cross-sectional view illustrating a semiconductor device according to an example embodiment, illustrating a region corresponding to FIG. 2A.

Referring to FIG. 6, in the semiconductor device 1a, a stacking order of patterns included in the memory cell structures MCa and a stacking order of patterns included in dummy cell structures DCa may be different. The data storage material pattern 150m may be disposed on a level lower than a level of the selector material pattern 130m. A lower electrode pattern 123m, a lower metal pattern 143m, a data storage material pattern 150m, an upper metal pattern 145m, an intermediate electrode pattern 125m, a selector material pattern 130m, and an upper electrode pattern 127m may be stacked in order on the first cell conductive lines CL1c. In the example embodiment, the intermediate electrode pattern 125m may have the same structure as that of the upper electrode pattern 127m illustrated in FIG. 3. For example, the intermediate electrode pattern 125m illustrated in FIG. 6 may include an edge portion EP (see FIG. 3) covering the second surface CS1a of the upper metal pattern 145m. The structure in the example embodiment may be formed by a laser annealing process (see FIG. 9C), and as described with reference to FIG. 3, the structure may appear in the memory cell structures MCa and also in the dummy cell structures DCa.

Figure 7:
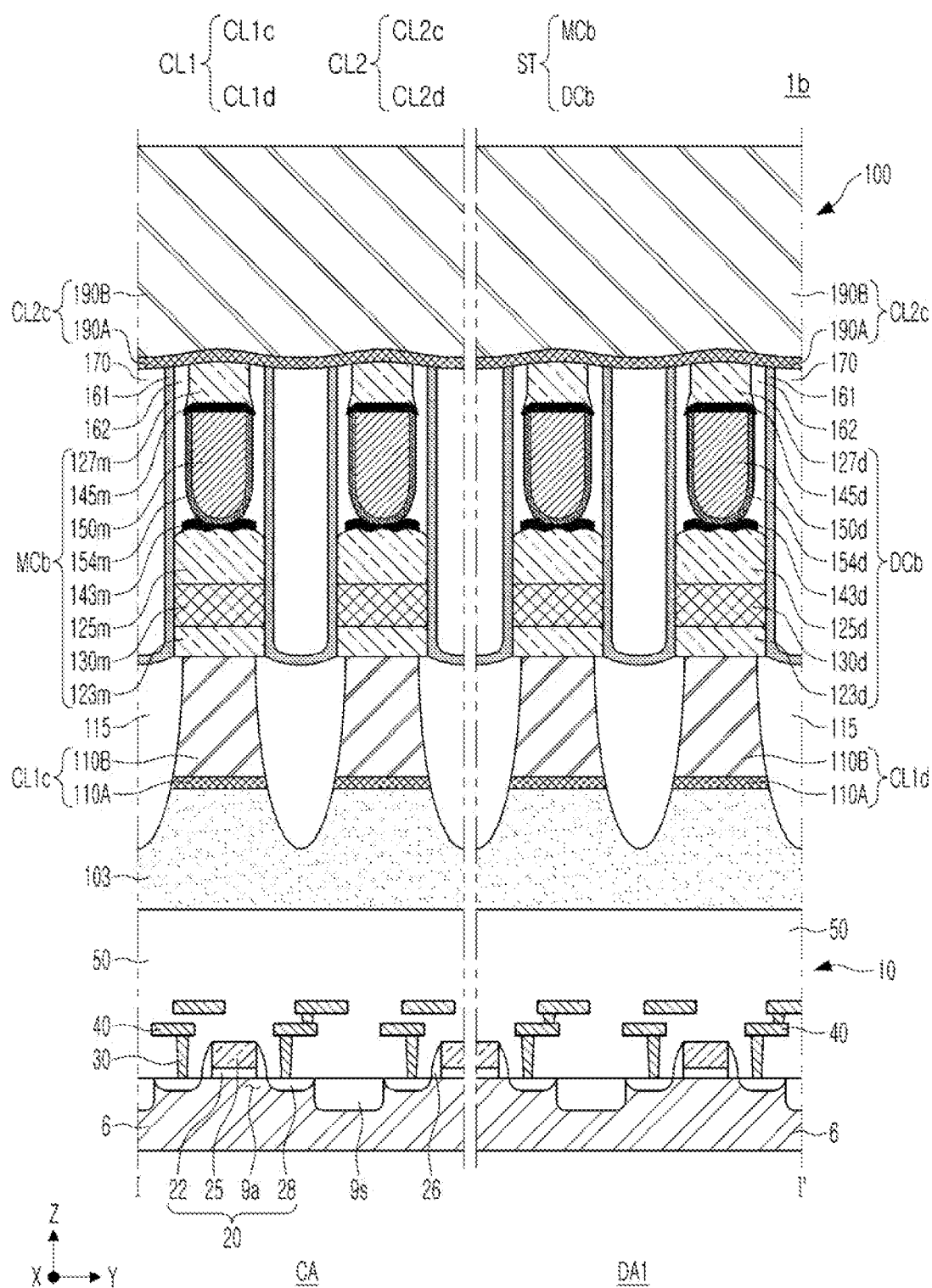

FIG. 7 is a cross-sectional view illustrating a semiconductor device according to an example embodiment, illustrating a region corresponding to FIG. 2A.

Referring to FIG. 7, in the semiconductor device 1b, in a memory cell structure MCb, the data storage material pattern 150m may be disposed in a "U"-shaped barrier layer 154m. In the example embodiment, a portion of the insulating layer may be removed from an upper portion using a damascene process to form an opening, the opening may be filled with the barrier layer 155 and the phase change material, and a planarization process may be performed. Also in the structure in the present example embodiment, by performing the laser annealing process (see FIG. 9C), the data storage material pattern 150m may be crystallized, and the upper metal pattern 145m and the upper electrode pattern 127m may have the same structure described with reference to FIG. 3. Also, the structure in the present example embodiment may appear in dummy cell structures DCb and also in the memory cell structures MCb, as described with reference to FIG. 3.

Figure 8A:
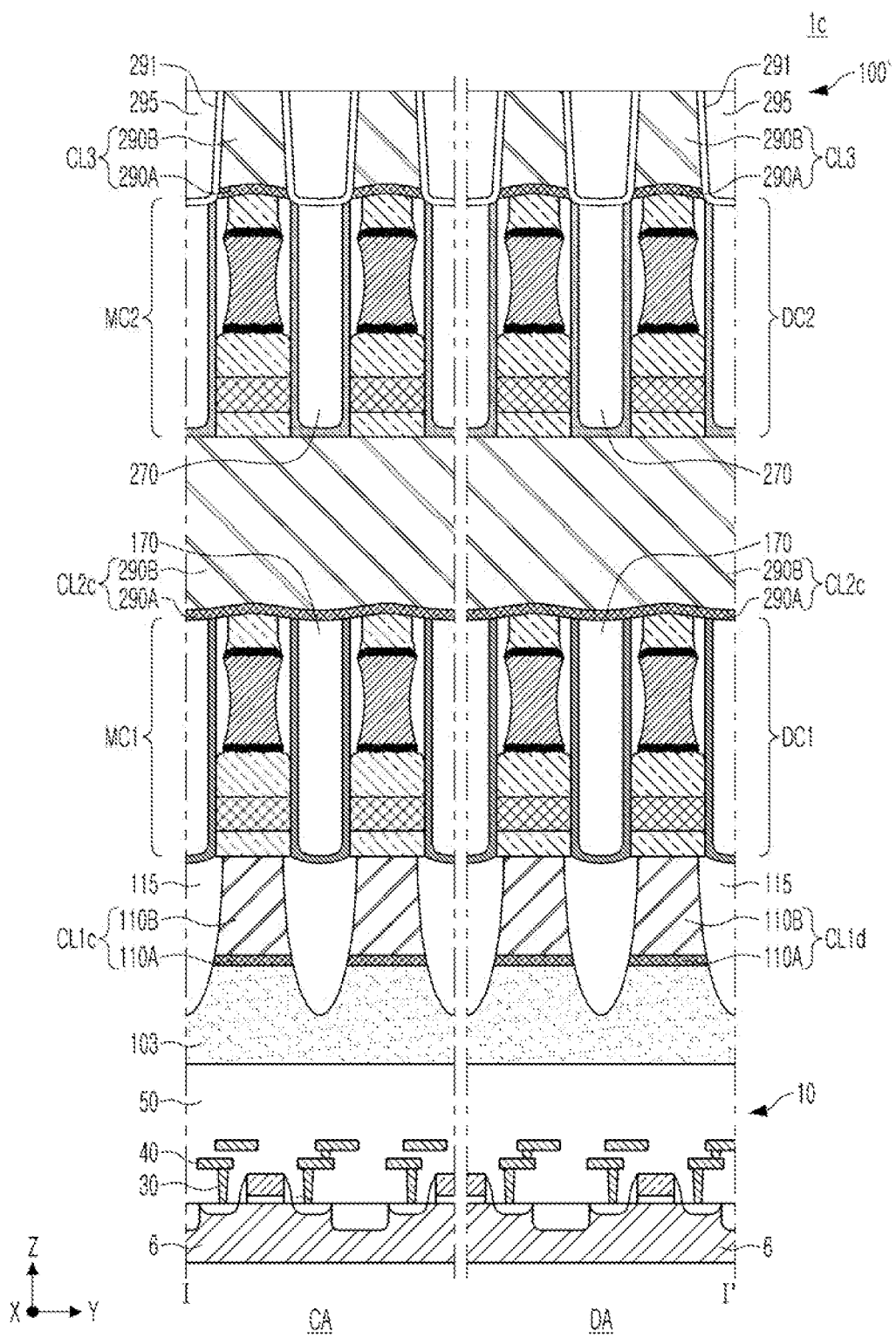
Figure 8B:
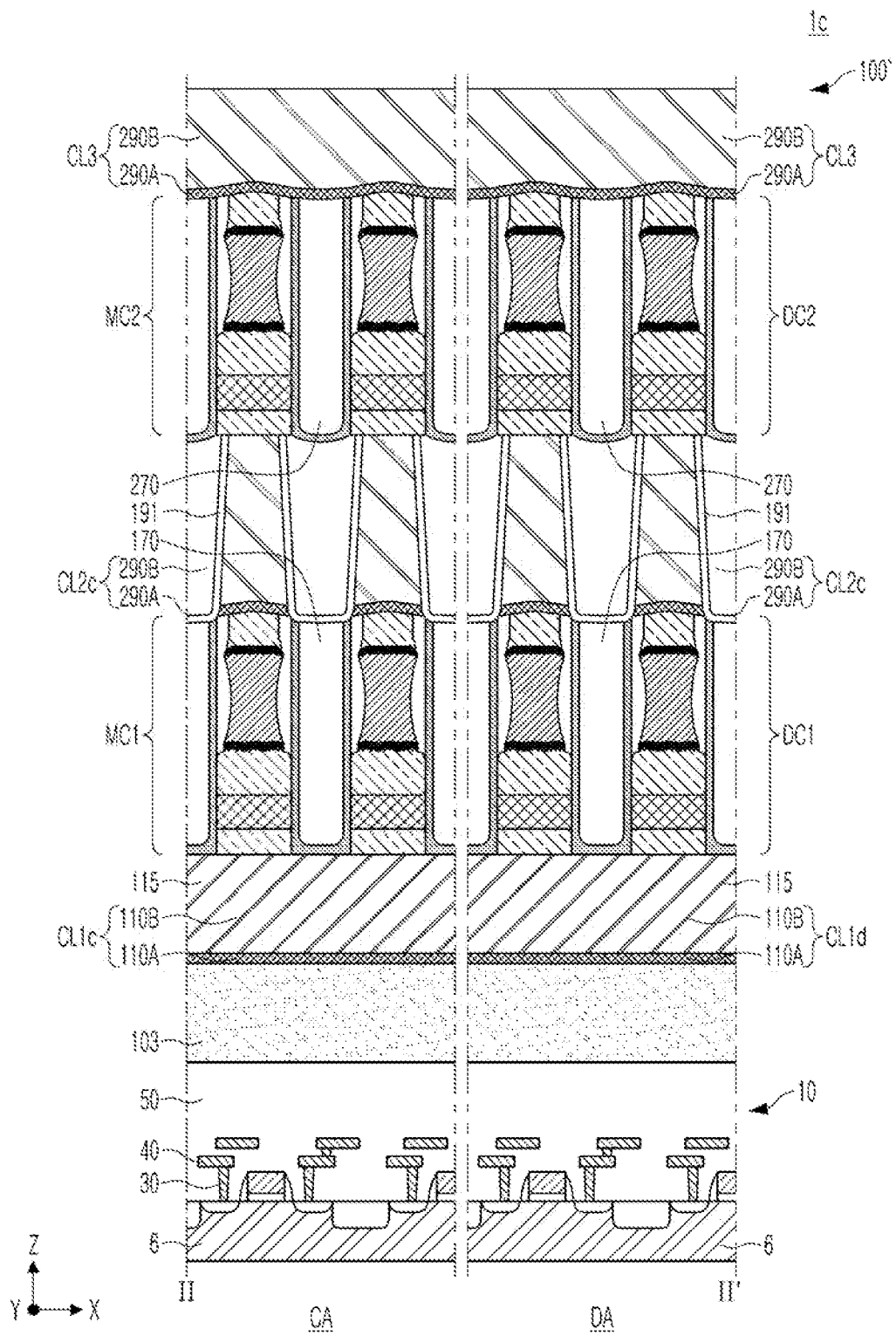

FIGS. 8A and 8B are cross-sectional views illustrating a semiconductor device according to an example embodiment.

FIG. 8A illustrates a region corresponding to FIG. 2A, and FIG. 8B illustrates a region corresponding to FIG. 2B.

Referring to FIGS. 8A and 8B, in the semiconductor device 1c, an upper structure 100' may include first conductive lines CL1, a first memory cell structure MC1, a first dummy cell structure DC1, a second memory cell structure MC, a second dummy cell structure DC2, and third conductive lines CL3 disposed on the second conductive lines CL2. The upper structure 100' may include fourth spacers 291 covering lateral surfaces of the third conductive lines CL3 and third insulating patterns 295 filling a space between the fourth spacers 291. The fourth spacers 291 may be disposed to be partially recessed into the upper portion of the second gap-fill insulating pattern 270.

The second memory cell structure MC2 may be disposed to overlap the first memory cell structure MC1 in the vertical direction Z. The second memory cell structure MC2 may have a structure the same as or similar to the first memory cell structure MC1. The first and second memory cell structures MC1 and MC2 may have the structures of the example embodiments illustrated in FIGS. 2A to 7.

The second dummy cell structure DC2 may be disposed to overlap the first dummy cell structure DC1 in the vertical direction Z. The second dummy cell structure DC2 may have a structure the same as or similar to the first dummy cell structure DC1. The first and second dummy cell structures DC1 and DC2 may have the structures of the example embodiments illustrated in FIGS. 2A to 7.

The third conductive lines CL3 may extend in the first direction X and may be spaced apart from each other in the second direction Y. Similar to that described with reference to FIG. 1A, the third conductive lines CL3 may include third cell conductive lines and third dummy conductive lines. The third conductive lines CL3 may include a third lower conductive layer 290A and a third upper conductive layer 290B. The third lower conductive layer 290A may be formed of a barrier layer such as titanium nitride (TiN), tungsten nitride (WN), or the like, and the third upper conductive layer 290B may be formed of a metal material such as tungsten (W), titanium (Ti), aluminum (Al), or copper (Cu).

As described above, in the upper structures 100, 100', the memory cell structures may have a single-stage structure (FIG. 2A) or a two-stage structure (FIG. 8). The number of stages may be single-stage, two-stage, four-stage, etc., each of which may include the example embodiments illustrated in FIGS. 1A to 7.

FIGS. 9A, 9B, 9C, and 9D are views illustrating a method of manufacturing a semiconductor device according to an example embodiment.

Referring to FIG. 9A, a lower structure 10 may be formed, and first conductive lines CL1 and first insulating patterns 115 may be formed on a base insulating layer 103. A plurality of layers 123', 130', 125', 143', 150', 145', and 127' may be formed on the first conductive lines CL1 and the first insulating patterns 115.

Forming the lower structure 10 may include preparing a semiconductor substrate 6, forming a device isolation layer 9s to define an active region 9a on the semiconductor substrate 6, and forming circuit devices 20 and a lower insulating structure 50 on the semiconductor substrate 6. The circuit devices 20 may include a gate insulating layer 22, a gate electrode 25, and source/drain regions 28 as described in FIG. 2A. The lower insulating structure 50 may cover the circuit devices 20. Circuit contact plugs 30 and circuit wirings 40 may be formed in the lower insulating structure 50.

First conductive lines CL1 may be formed on the lower insulating structure 50. Forming the first conductive lines CL1 may include forming a lower conductive layer and an upper conductive layer, and patterning the lower conductive layer and the upper conductive layer. The first conductive lines CL1 may be formed to have a linear shape extending in the first horizontal direction X. First insulating patterns 112 may be formed between the first conductive lines CL1. The first insulating patterns 112 may be formed to extend in the first horizontal direction X.

A plurality of layers 123', 130', 125', 143', 150', 145', and 127' may be partially etched in a subsequent process (described below) and may form the memory cell structures MC or may form the dummy cell structures DC. The plurality of layers 123', 130', 125', 143', 150', 145' and 127' may have different thicknesses, or a portion of the plurality of layers 123', 130', 125', 143', 150', 145' and 127' may be formed to have substantially the same thickness. The material layer 150' including the phase change material among the plurality of layers 123', 130', 125', 143', 150', 145' and 127' may be formed in an amorphous form. The material layer 150' including the phase change material among the plurality of layers 123', 130', 125', 143', 150', 145', and 127' may have an amorphous phase. The material layer 150' including the phase change material may be a material layer formed as the second dummy pattern 150d of the dummy cell structure DC through a subsequent process. When the laser annealing process is not performed, since the second dummy pattern 150d of the dummy cell structure DC disposed in the dummy area DA is electrically isolated, the phase change material layer of the second dummy pattern 150d may be maintained in an amorphous state.

Referring to FIG. 9B, a plurality of patterns 123", 130", 125", 143", 150", 145", and 127" may be formed by patterning a plurality of layers 123', 130', 125', 143', 150', 145', and 127'.

Patterning the plurality of layers 123', 130', 125', 143', 150', 145', and 127' may be implemented in various manners. For example, the plurality of layers 123', 130', 125', 143', 150', 145' and 127' may be formed as island-type patterns by a single etching process, or may be formed as island-type patterns by performing a first etching process for patterning in the first direction X and a second etching process for patterning in the second direction Y. After the first etching process, first spacers 161 covering lateral surfaces of a portion of the plurality of patterns 143", 150", 145" and 127" may be formed before the second etching process.

Referring to FIG. 9C, a laser annealing process LA may be performed.

In the laser annealing process LA, for example, a laser beam having a size of 30 μm×2400 μm may be used. The size of the laser beam is not limited thereto, and may be, e.g., 2 cm×2 cm. The laser annealing process LA may be performed at a frequency ranging from about 5 Hz to about 10,000 Hz. A scanning speed of the laser annealing process LA may be about 5 mm/s to about 300 mm/s, and a dwell time of the laser annealing process LA may be about 1800 ns to about 54,000 ns. A peak power of a laser output of the laser annealing process LA may be about 0.1 kW to about 4000 kW, energy density may be about 0.1 J/cm2 to about 4 J/cm2, and a wavelength may range from about 250 nm to about 1000 nm. The laser annealing process LA may be performed in an inert gas atmosphere such as Ar, $N_2$, or the like, under pressure conditions of about 1 Torr to about 10 Torr.

The laser annealing process LA may be performed over an entire area of the semiconductor substrate 6. The pattern 150" including an amorphous phase change material may be formed as the data storage material pattern 150m including a crystalline phase change material by the laser annealing process LA.

As the data storage material pattern 150m is crystallized, etching damage of the phase change material may be cured, and internal voids may be removed, such that crystallinity and density may be increased. A grain size of the phase change material of the data storage material pattern 150m may be increased by the laser annealing process LA. For example, a grain size included in the phase change material of the pattern 150" before the laser annealing process LA may be about 5 nm or less, and a grain size included in the phase change material layer of the data storage material pattern 150m after the laser annealing process LA is performed may range from about 5 nm to about 20 nm.

As the data storage material pattern 150m is crystallized, a width thereof may be decreased and a height thereof may be increased. The pattern 150" including the phase change material may have a reference width Wp and a first height h1 before the laser annealing process LA is performed. The data storage material pattern 150m on which the laser annealing process LA is performed may have widths W1, W2, and W3 narrower than the reference width Wp, and may have a second height h2 greater than the first height h1. For example, a lower region LR of the data storage material pattern 150m may have a first width W1 narrower than the reference width Wp, and the intermediate region MR may have a second width W2 narrower than the reference width Wp, and the upper region UR may have a third width W3 narrower than the reference width Wp.

In an example, the first width W1 may be narrower than a width Wp1 of a lower region of a material layer 150" by about 5% to about 20% of the width Wp1. The second width W2 may be narrower than a width Wp2 of an intermediate region of the material layer 150" by about 2% to about 10% of the width Wp2. The third width W3 may be narrower than a width Wp3 of an upper region of the material layer 150" by about 5% to about 20% of the width Wp3. The width Wp2 of the intermediate region of the material layer 150" may be smaller than the width Wp1 of the lower region of the material layer 150" and the width Wp3 of the upper region of the material layer 150".

The upper metal pattern 145m may be formed to have a structure as illustrated in FIG. 3 by a structural change of the data storage material pattern 150m in this process. Accordingly, an end of the upper metal pattern 145m may be bent downwardly towards the first conductive lines CL1 or the semiconductor substrate 6.

In this process, the upper electrode pattern 127m may be formed to have a structure as illustrated in FIG. 3 by a structural change of the data storage material pattern 150m and a structural change of the upper metal pattern 145m. Accordingly, the upper electrode pattern 127m may be formed to include the edge portion EP covering the second surface CS1a of the upper metal pattern 145m.

In this process, the structural changes of the data storage material pattern 150m, the upper metal pattern 145m, and the upper electrode pattern 127m obtained by the laser annealing process LA has been described, and the laser annealing process LA may also be performed to the dummy cell structure DC such that the structures of the second dummy pattern 150d, the dummy upper metal pattern 145d, and the dummy upper electrode pattern 127d may also be changed similarly to the aforementioned example embodiment. For example, density and crystallinity of the phase change material of the second dummy pattern 150d may increase. The second dummy pattern 150d may include a phase change material electrically isolated and maintaining a crystalline phase during a write operation or an erase operation of the semiconductor device.

Figure 9D:
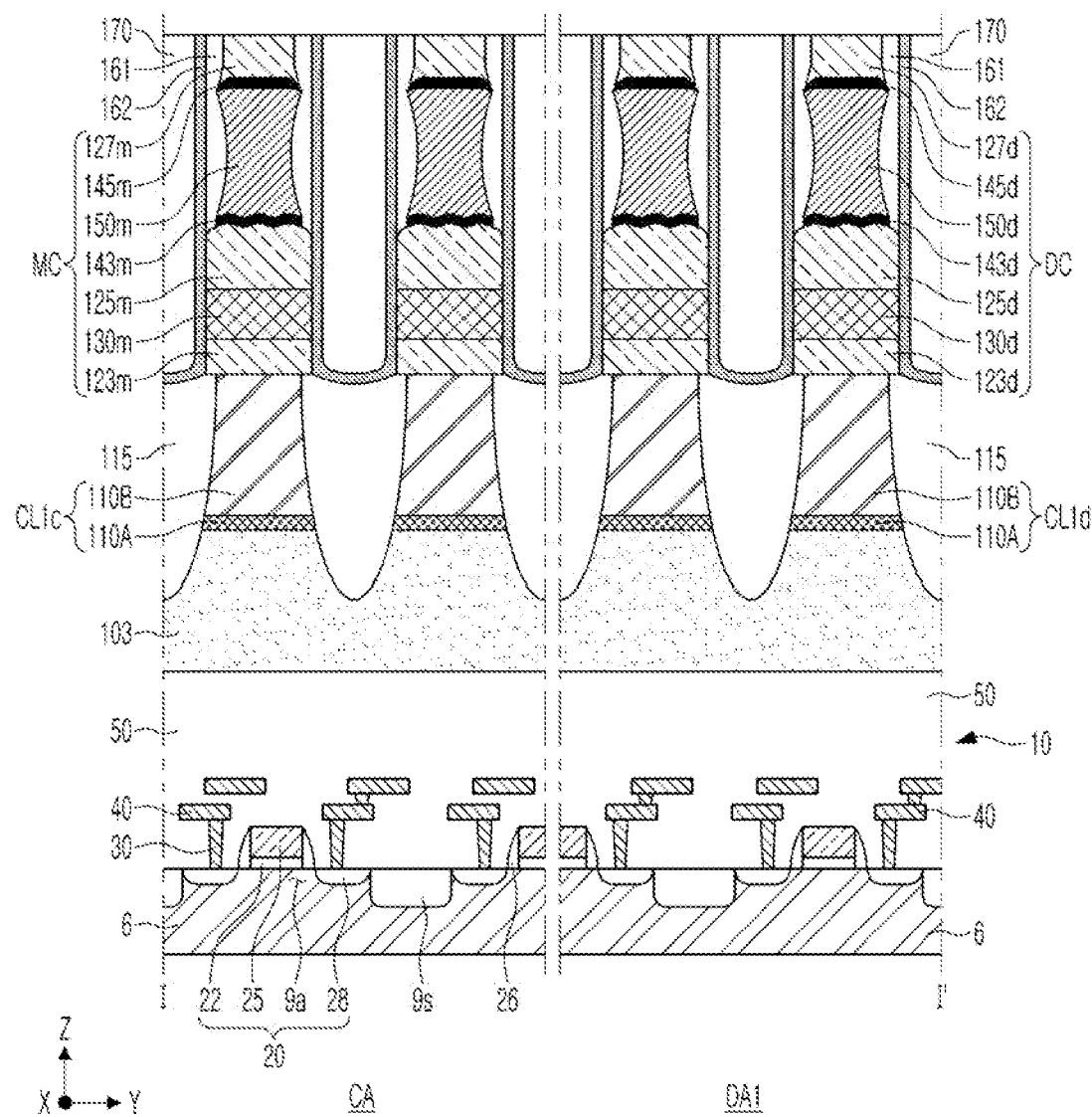

Referring to FIG. 9D, second spacers 162 may be formed and a gap-fill insulating pattern 170 may be formed.

The second spacers 162 may be formed on external lateral surfaces of the first spacers 161, and may cover lateral surfaces of the lower electrode pattern 123m, the selector material pattern 130m, and the intermediate electrode pattern 125m. In example embodiments, the first and second spacers 161 and 162 may be formed of a plurality of layers. Alternatively, the first and second spacers 161 and 162 may not be provided.

The gap-fill insulating pattern 170 may be formed on the first and second spacers 161 and 162 between the memory cell structures MC and between the dummy cell structures DC. In example embodiments, the laser annealing process LA may be performed after, e.g., only after, the first and second spacers 161 and 162 and the gap-fill insulating pattern 170 are formed.

Thereafter, referring to FIGS. 2A and 2B, second conductive lines CL2, third spacers 191, and second insulating patterns 195 may be formed.

The second conductive lines CL2 may be formed on the memory cell structure MC and the dummy cell structure DC. Forming the second conductive lines CL2 may include forming a lower conductive layer and an upper conductive layer, and patterning the lower conductive layer and the upper conductive layer. The second conductive lines CL2 may be formed to extend in the second direction Y. The third spacers 191 may be formed to cover lateral surfaces of the second conductive lines CL2. The second insulating patterns 195 may be disposed to cover the third spacers 192 between the second conductive lines CL2. Accordingly, the semiconductor device 1 illustrated in FIGS. 2A and 2B may be manufactured.

Figure 10:
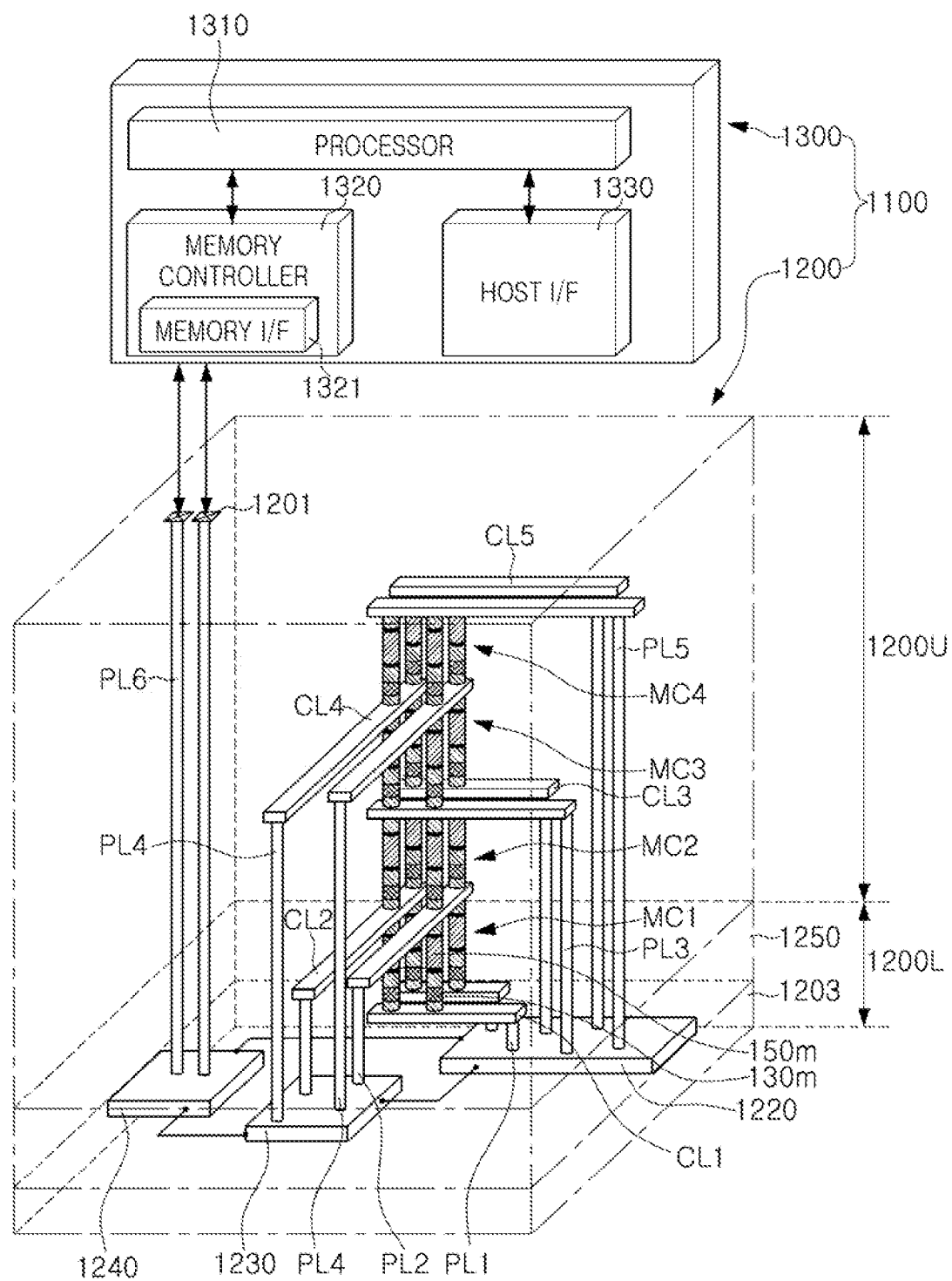
FIG. 10 is a view illustrating an electronic system including a semiconductor device according to an example embodiment.

FIG. 10 is a view illustrating an electronic system including a semiconductor device according to an example embodiment.

Referring to FIG. 10, an electronic system 1100 in an example embodiment may include a semiconductor device 1200 and a controller 1300 electrically connected to the semiconductor device 1200. The electronic system 1100 may be implemented by a storage device including a semiconductor device 1200 or an electronic device including a storage device. For example, the electronic system 1100 may be implemented by a solid state drive device (SSD) including the semiconductor device 1200, a universal serial bus (USB), a computing system, medical equipment, or a communication device.

The semiconductor device 1200 may be a semiconductor device described in the aforementioned example embodiments with reference to FIGS. 1A to 8. The semiconductor device 1200 may include a first structure 1200L and a second structure 1200U on the first structure 1200L.

The first structure 1200L may include a row driver 1220, a column driver 1230, a control logic 1240 electrically connected to the row driver 1220 and the column driver 1230. The row driver 1220 may include an address decoder for selecting data storage material patterns (e.g., 150m in FIG. 2A) of a memory cell structure (e.g., MC in FIG. 1B) to write data therein or read data therefrom. The column driver 1230 may include a read/write circuit for writing data in the data storage material patterns (e.g., 150m in FIG. 2A)

of the memory cell structure (e.g., MC in FIG. 1B), or for reading data from the data storage material patterns 150m. Operations of the row driver 1220 and the column driver 1230 may be controlled by the control logic 1240. The first structure 1200L may be the lower structure 10 (in FIG. 2A) described with reference to FIGS. 1A to 3.

The second structure 1200U may include a plurality of memory cell structures stacked in a vertical direction.

In an example embodiment, the plurality of memory cell structures may include two or more memory cell structures. For example, the plurality of memory cell structures may include first to fourth memory cell structures MC1, MC2, MC3, and MC4 stacked in a vertical direction. Each of the first to fourth memory cell structures MC1, MC2, MC3, and MC4 may include the data storage material pattern 150m and the selector material pattern 130m as illustrated in FIG. 2A.

In an example embodiment, a structure in which more than four memory cell structures are vertically stacked may be included.

The second structure 1200U may include first conductive lines CL1 disposed between the first memory cell structure MC1 and the first structure 1200L and extending in a first direction, second conductive lines CL2 disposed between the first memory cell structure MC1 and the second memory cell structure MC2 and extending in the second direction, third conductive lines CL3 disposed between the second memory cell structure MC2 and the third memory cell structure MC3 and extending in the first direction, fourth conductive lines CL4 disposed between the third memory cell structure MC3 and the fourth memory cell structure MC4 and extending in the second direction, and fifth conductive lines CL5 extending in the first direction on the fourth memory cell structure MC4. The first to fifth conductive lines CL1, CL2, CL3, CL4, and CL5 may refer to cell conductive lines other than dummy conductive lines.

In an example embodiment, the first, third, and fifth conductive lines CL1, CL3, and CL5 may be word lines, and the second and fourth conductive lines CL2 and CL4 may be bit lines.

The second structure 1200U may further include first, third, and fifth contact structures PL1, PL3, and PL5 electrically connecting the first, third, and fifth conductive lines CL1, CL3, and CL5 to the row driver 1220, and second and fourth contact structures PL2 and PL4 electrically connecting the second and fourth conductive lines CL2 and CL4 to the column driver 1230. The first contact structure PL1 may correspond to the connection structure PL1 illustrated in FIG. 1B, and the second contact structure PL2 may correspond to the connection structure PL2 illustrated in FIG. 1B.

The second structure 1200U may include an input/output pad 1201. The semiconductor device 1200 may include an input/output contact structure PL6 electrically connected to the input/output pad 1201, penetrating the second structure 1200U, extending into the first structure 1200L, and electrically connected to the control logic 1240.

The semiconductor device 1200 may communicate with the controller 1300 through the input/output pad 1201 electrically connected to the control logic 1240. The controller 1300 may include a processor 1310, a memory controller 1320, and a host interface 1330. In example embodiments, the electronic system 1100 may include a plurality of semiconductor devices 1200, and in this case, the controller 1300 may control the plurality of semiconductor devices 1200.

The processor 1310 may control overall operation of the electronic system 1100 including the controller 1300. The processor 1310 may operate according to a predetermined firmware, and may access the semiconductor device 1200 by controlling the memory controller 1320. The memory controller 1320 may include a memory interface 1321 for processing communication with the semiconductor device 1200.

A control command for controlling the semiconductor device 1200, data to be written in the data storage material patterns 150m of the memory cell structures MC1, MC2, MC3, and MC4 of the semiconductor device 1200, and data to be read from the data storage material patterns 150m of the memory cell structures MC1, MC2, MC3, and MC4 of the semiconductor device 1200 may be transmitted through the memory interface 1321. The host interface 1330 may provide a communications function between the electronic system 1100 and an external host. When a control command is received from an external host through the host interface 1330, the processor 1310 may control the semiconductor device 1200 in response to the control command.

Embodiments may provide a semiconductor device including a data storage material pattern. According to the aforementioned example embodiments, a laser annealing process may be performed on the data storage material pattern, which may enhance crystallinity and density such that a semiconductor device having improved electrical properties and reliability may be provided.

By performing a laser annealing process on the data storage material pattern, a width of the data storage material pattern may be decreased and a height of the data storage material pattern may be increased, such that resistance of a phase change material of the data storage material pattern may increase and a threshold voltage may increase, thereby providing a semiconductor device having improved electrical properties.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a semiconductor substrate having a cell region and a dummy region;
   first conductive lines extending in a first direction on the semiconductor substrate;
   second conductive lines disposed on the first conductive lines and extending in a second direction perpendicular to the first direction;
   a plurality of memory cell structures disposed between the first conductive lines and the second conductive lines on the cell region of the semiconductor substrate; and
   a plurality of dummy cell structures that are electrically isolated and disposed between the first conductive lines and the second conductive lines on the dummy region of the semiconductor substrate,
   wherein each of the plurality of memory cell structures includes:

a data storage material pattern disposed between the first conductive lines and the second conductive lines and including a phase change material layer; and a selector material pattern overlapping the data storage material pattern in a vertical direction, wherein each of the plurality of dummy cell structures includes a dummy pattern disposed between the first conductive lines and the second conductive lines and including a phase change material layer, wherein the phase change material layer of the dummy pattern includes a crystalline phase portion and an amorphous phase portion, and wherein, at a cross section of the phase change material layer of the dummy pattern, an area of the crystalline phase portion is larger than an area of the amorphous phase portion.

2. The semiconductor device as claimed in claim 1,
wherein the first conductive lines include first cell conductive lines disposed on the cell region and first dummy conductive lines disposed on the dummy region, wherein the second conductive lines include second cell conductive lines disposed on the cell region and second dummy conductive lines disposed on the dummy region, wherein the first dummy conductive lines or the second dummy conductive lines are electrically floating, wherein the plurality of memory cell structures are disposed in a region in which the first cell conductive lines intersect the second cell conductive lines, and wherein the plurality of dummy cell structures are disposed on at least one of a first dummy region in which the first cell conductive lines intersect the second dummy conductive lines, a second dummy region in which the second cell conductive lines intersect the first dummy conductive lines, and a third dummy region in which the first dummy conductive lines intersect the second dummy conductive lines.

3. The semiconductor device as claimed in claim 1, wherein, at a cross-section of the phase change material layer of the dummy pattern, the area of the crystalline phase portion is about 80% or more of an entire area of the phase change material layer of the dummy pattern.

4. The semiconductor device as claimed in claim 1,
wherein each of the plurality of dummy cell structures further includes:
a lower metal pattern disposed below the dummy pattern;
an upper metal pattern disposed on the dummy pattern;
a lower electrode pattern disposed below the lower metal pattern; and
an upper electrode pattern disposed on the upper metal pattern,
wherein an upper surface of the upper metal pattern includes a first surface and a second surface that extends from the first surface and bends downward towards the semiconductor substrate, and
wherein the upper electrode pattern includes an edge portion covering at least a portion of the second surface of the upper surface of the upper metal pattern.

5. The semiconductor device as claimed in claim 4,
wherein at least a portion of the second surface of the upper surface of the upper metal pattern is a curved surface, and
wherein a maximum value of an angle formed by a conceptual linear line extending from the first surface of the upper surface of the upper metal pattern and a tangent of the curved surface is in a range of about 10° to about 70°.

6. The semiconductor device as claimed in claim 4,
wherein a lower surface of the upper electrode pattern includes a first surface and a second surface that extends from the first surface and bends downward towards the semiconductor substrate,
wherein the first surface of the lower surface of the upper electrode pattern covers the first surface of the upper surface of the upper metal pattern, and
wherein the second surface of the lower surface of the upper electrode pattern covers at least a portion of the second surface of the upper surface of the upper metal pattern.

7. The semiconductor device as claimed in claim 6, wherein the edge portion of the upper electrode pattern is pointed.

8. The semiconductor device as claimed in claim 4,
wherein the dummy pattern includes a lower region adjacent to the lower metal pattern, an upper region adjacent to the upper metal pattern, and an intermediate region disposed between the lower region and the upper region, and
wherein a width of the upper region is greater than a width of the intermediate region.

9. The semiconductor device as claimed in claim 8, wherein a width of the lower region is greater than the width of the intermediate region.

10. The semiconductor device as claimed in claim 1, wherein the selector material pattern includes an ovonic threshold switching material layer.

11. The semiconductor device as claimed in claim 1,
wherein each of the plurality of memory cell structures includes:
a first metal pattern disposed below the data storage material pattern;
a second metal pattern disposed on the data storage material pattern;
a first electrode pattern disposed below the first metal pattern; and
a second electrode pattern disposed on the second metal pattern,
wherein an end portion of the second metal pattern bends downward towards the semiconductor substrate,
wherein an edge portion of a lower portion of the second electrode pattern bends downward towards the semiconductor substrate, and
wherein the second electrode pattern includes a portion in which a horizontal distance between lateral surfaces of the second electrode pattern increases downwardly.

12. A semiconductor device, comprising:
a semiconductor substrate;
a first conductive line extending in a first direction on the semiconductor substrate;
a second conductive line disposed on the first conductive line and extending in a second direction perpendicular to the first direction; and
a stack structure disposed between the first conductive line and the second conductive line on the semiconductor substrate,
wherein the stack structure includes:
a lower electrode pattern in contact with the first conductive line;
an upper electrode pattern in contact with the second conductive line;

an intermediate electrode pattern disposed between the lower electrode pattern and the upper electrode pattern;
a first material pattern and a second material pattern spaced apart from each other in a vertical direction by the intermediate electrode pattern;
a lower metal pattern in contact with a lower surface of the second material pattern; and
an upper metal pattern in contact with an upper surface of the second material pattern,
wherein an upper surface of the upper metal pattern includes a first surface and a second surface that extends from the first surface and bends downward towards the semiconductor substrate, and
wherein a lower portion of a lateral surface of the upper electrode pattern is tapered such that a width of the upper electrode pattern increases towards a lower end.

13. The semiconductor device as claimed in claim 12, wherein the upper electrode pattern includes an edge portion covering the second surface of the upper surface of the upper metal pattern, the edge portion being pointed, and
wherein a lower end of the edge portion is disposed on a level lower than a level of the first surface of the upper surface of the upper metal pattern.

14. The semiconductor device as claimed in claim 13, wherein the lower surface of the upper electrode pattern includes a first surface and a second surface that extends from the first surface and bends downward towards the semi conductor substrate,
wherein the first surface of the lower surface of the upper electrode pattern covers the first surface of the upper surface of the upper metal pattern, and
wherein the second surface of the lower surface of the upper electrode pattern covers at least a portion of the second surface of the upper surface of the upper metal pattern.

15. The semiconductor device as claimed in claim 12, wherein at least a portion of the second surface of the upper surface of the upper metal pattern is a curved surface, and
wherein a maximum value of an angle formed by a conceptual linear line extending from the first surface of the upper surface of the upper metal pattern and a tangent of the curved surface is in a range of about 10° to about 70°.

16. The semiconductor device as claimed in claim 12, wherein the upper metal pattern includes a central portion including the first surface of the upper surface of the upper metal pattern and an end portion including the second surface of the upper surface of the upper metal pattern, and
wherein a lower end of the end portion of the upper metal pattern is disposed on a level lower than a level of a lower end of the central portion.

17. The semiconductor device as claimed in claim 16, wherein the end portion of the upper metal pattern includes a portion of which a thickness in the vertical direction decreases in a direction away from the central portion.

18. A semiconductor device, comprising:
a lower structure including a semiconductor substrate and a peripheral circuit on the semiconductor substrate;
first cell conductive lines extending in a first direction on the lower structure;
first insulating patterns disposed on lateral surfaces of the first cell conductive lines and having lower ends disposed on a level lower than a level of lower ends of the first cell conductive lines;
second cell conductive lines disposed on the first cell conductive lines and extending in a second direction perpendicular to the first direction;
second insulating patterns on lateral surfaces of the second cell conductive lines;
a plurality of memory cell structures disposed between the first cell conductive lines and the second cell conductive lines on the semiconductor substrate; and
a plurality of dummy cell structures that are electrically isolated and disposed on substantially the same level as a level of the plurality of memory cell structures on the semiconductor substrate,
wherein each of the plurality of memory cell structures includes a lower electrode pattern, a selector material pattern on the lower electrode pattern, an intermediate electrode pattern on the selector material pattern, a lower metal pattern on the intermediate electrode pattern, a data storage material pattern on the lower metal pattern, an upper metal pattern on the data storage material pattern, and an upper electrode pattern on the upper metal pattern,
wherein each of the plurality of dummy cell structures includes a dummy lower electrode pattern, a first dummy pattern on the dummy lower electrode pattern, a dummy intermediate electrode pattern on the first dummy pattern, a dummy lower metal pattern on the dummy intermediate electrode pattern, a second dummy pattern on the dummy lower metal pattern, a dummy upper metal pattern on the second dummy pattern, and a dummy upper electrode pattern on the dummy upper metal pattern,
wherein the data storage material pattern includes a phase change material layer, of which a phase changes from an amorphous phase to a crystalline phase or from a crystalline phase to an amorphous phase during a write operation and an erase operation,
wherein the second dummy pattern includes a phase change material layer that is electrically isolated and maintains a crystalline phase, and
wherein each of the upper metal pattern and the dummy upper metal pattern includes a central portion and an end portion that extends from the central portion and bends downward.

19. The semiconductor device as claimed in claim 18, wherein each of the selector material pattern and the first dummy pattern includes an ovonic threshold switching material layer,
wherein the selector material pattern and the ovonic threshold switching material layer of the first dummy pattern include an amorphous phase portion,
wherein the phase change material layer of the second dummy pattern includes a crystalline phase portion and an amorphous phase portion, and
wherein, at a cross-section of the phase change material layer of the second dummy pattern, an area of the crystalline phase portion is larger than an area of the amorphous phase portion of the second dummy pattern.

20. The semiconductor device as claimed in claim 18, wherein an upper surface of the upper metal pattern includes a first surface and a second surface that extends from the first surface and bends downward towards the semiconductor substrate, and
wherein the upper electrode pattern includes an edge portion covering at least a portion of the second surface and having a sharp shape.

* * * * *